(12) United States Patent
    Nishizaki

(10) Patent No.: US 10,304,497 B2
(45) Date of Patent: May 28, 2019

(54) POWER SUPPLY WIRING IN A SEMICONDUCTOR MEMORY DEVICE

(71) Applicant: Micron Technology, Inc., Boise, ID (US)

(72) Inventor: Mamoru Nishizaki, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/709,250

(22) Filed: Sep. 19, 2017

(65) Prior Publication Data

US 2019/0057726 A1  Feb. 21, 2019

Related U.S. Application Data

(60) Provisional application No. 62/547,022, filed on Aug. 17, 2017.

(51) Int. Cl.
| | | |
|---|---|---|
| G11C 5/06 | (2006.01) | |
| H01L 23/528 | (2006.01) | |
| G11C 5/02 | (2006.01) | |
| G11C 7/12 | (2006.01) | |
| G11C 7/10 | (2006.01) | |
| H01L 23/522 | (2006.01) | |
| G11C 7/06 | (2006.01) | |

(52) U.S. Cl.
CPC .............. *G11C 5/063* (2013.01); *G11C 5/025* (2013.01); *G11C 7/06* (2013.01); *G11C 7/1051* (2013.01); *G11C 7/1078* (2013.01); *G11C 7/12* (2013.01); *H01L 23/5226* (2013.01); *H01L 23/5286* (2013.01)

(58) Field of Classification Search
CPC ...................................................... G11C 5/063
USPC .......................................................... 365/63
See application file for complete search history.

(56) References Cited

U.S. PATENT DOCUMENTS

| | | |
|---|---|---|
| 5,594,371 A | 1/1997 | Douseki |
| 6,278,148 B1 | 8/2001 | Watanabe et al. |
| 6,292,015 B1 | 9/2001 | Ooishi et al. |
| 6,310,487 B1 | 10/2001 | Yokomizo |
| 8,269,348 B2 | 9/2012 | Fazelpour |
| 10,020,252 B2 | 7/2018 | Miura et al. |
| 2003/0038653 A1 | 2/2003 | Ooishi et al. |

(Continued)

FOREIGN PATENT DOCUMENTS

JP        11031385 A      2/1999

OTHER PUBLICATIONS

U.S. Appl. No. 15/344,211, entitled "Wiring With External Terminal", filed Nov. 4, 2016.

(Continued)

*Primary Examiner* — Hoai V Ho
(74) *Attorney, Agent, or Firm* — Dorsey & Whitney LLP

(57) ABSTRACT

The present disclosure relates generally to the field of power supply wiring in a semiconductor device. In one embodiment, a semiconductor device is disclosed that includes, an uppermost metal layer including a power supply enhancing wiring, power supply wiring coupled to the power supply enhancing wiring through a via between the uppermost metal layer and a metal layer underlying the uppermost metal layer, and at least one memory device component disposed in vertical alignment with the via between the uppermost metal layer and the metal layer underlying the uppermost metal layer.

10 Claims, 12 Drawing Sheets

(56) References Cited

U.S. PATENT DOCUMENTS

| | | | |
|---|---|---|---|
| 2004/0047229 A1* | 3/2004 | Fujisawa | G11C 5/025 365/232 |
| 2004/0217776 A1 | 11/2004 | Horiguchi et al. | |
| 2006/0227587 A1 | 10/2006 | Nakamura et al. | |
| 2006/0267219 A1 | 11/2006 | Nakamura et al. | |
| 2007/0045828 A1 | 3/2007 | Kwon et al. | |
| 2008/0220607 A1 | 9/2008 | Hummler | |
| 2009/0290271 A1 | 11/2009 | Yang et al. | |
| 2010/0214812 A1 | 8/2010 | Kim | |
| 2010/0230780 A1* | 9/2010 | Obayashi | G11C 17/18 257/529 |
| 2010/0301466 A1 | 12/2010 | Taoka et al. | |
| 2011/0254617 A1 | 10/2011 | Ishii et al. | |
| 2013/0285247 A1 | 10/2013 | Minda et al. | |
| 2014/0003113 A1 | 1/2014 | Seno et al. | |
| 2014/0063887 A1 | 3/2014 | Vogelsang | |
| 2015/0035054 A1 | 2/2015 | Nishizaki | |
| 2015/0108637 A1 | 4/2015 | Usami et al. | |
| 2015/0221714 A1 | 8/2015 | Gu et al. | |
| 2015/0302900 A1 | 10/2015 | Lee et al. | |
| 2017/0110160 A1 | 4/2017 | Seo et al. | |
| 2017/0110161 A1 | 4/2017 | Seo | |
| 2018/0130739 A1 | 5/2018 | Miura et al. | |
| 2018/0254245 A1 | 9/2018 | Miura et al. | |

OTHER PUBLICATIONS

"RDL—Bond Pad Redistribution Layers", obtained at: http://www.yieldengineering.com/portals/0/yes-rdl_explanation.pdf on Nov. 4, 2016.

U.S. Appl. No. 15/669,801, titled, "Wiring With External Terminal", filed Aug. 4, 2017.

U.S. Appl. No. 15/973,046, titled "Wiring With External Terminal", filed May 7, 2018.

International Search Report and Written Opinion dated Nov. 27, 2018 for PCT Application No. PCT/US2018/045813, 15 pages.

* cited by examiner

US 10,304,497 B2

POWER SUPPLY WIRING IN A SEMICONDUCTOR MEMORY DEVICE

CROSS-REFERENCE TO RELATED APPLICATION

This application claims the filing benefit of Provisional Application No. 62/547,022, filed Aug. 17, 2017. This application is incorporated by reference herein in its entirety and for all purposes.

TECHNICAL FIELD

The present disclosure relates generally to the field of power supply wiring in a semiconductor device. More specifically, the present disclosure relates to routing of vias for power supply enhancing wiring.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored information in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor.

Memory devices typically includes power supply lines throughout the device that provide power from a power supply to the venous transistors and other components that are included in the memory. The power supply lines are typically arranged in different metal layers associated with the device. The resistivity of these power supply lines can dissipate power and generate heat as power is transmitted from the power supply. The farther power travels along the power supply lines, the greater this power dissipation and heat generation can be. Additionally, some metal layer have greater resistivity than others. In some cases, lower metal layer have higher resistivity than upper metal layers. Thus, power that is transmitted on power supply lines located in lower metal layers may be more susceptible to dissipation than power that is transmitted on power supply lines that located in upper metal layers.

In order to reduce these power dissipation and heating issues, some memory devices include a redistribution layer that includes low resistivity lines that provide power to certain locations within the device. This layer may be referred to as an "iRDL layer" and may be formed in a semiconductor process that occurs before an assembly process. An iRDL layer may be an uppermost layer of the device, which may be the lowest resistivity layer in the device. In some cases, an iRDL layer is a metal 4 layer (M4) over the metal 3 layer (M3).

In order for power to be transferred from the iRDL layer to lower layers of a memory device, the memory device may include one or more vias, also known as contact plugs. A memory device may include one or more "iRDL vias" that provide conductive pathways between power distribution lines in the iRDL layer ("iRDL lines") to wiring that is this located in an underlying metal layer. In one example, an iRDL via provides a conductive pathway between a metal 4 layer and a metal 3 layer. The memory device may also include additional vias that provide conductive pathways between other layers, such as M3-M2 vias.

Conventionally, a memory device includes a dedicated area for routing of iRDL vias. These dedicated areas are used to avoid interference with control signals or other wiring that may be present in areas that underlie the redistribution layer. These dedicated areas result in unwanted increases in chip size, power consumption and other disadvantages. Thus, there is a need in the art for improved iRDL via routing.

DETAILED DESCRIPTION

Embodiments of the present disclosure avoid conventional arrangements that include a dedicated iRDL layout region. Instead of using a dedicated region, present embodiments route iRDL vias in device locations that lack certain metal layer wirings, but contain other device components such that the iRDL via routing area is not exclusively dedicated to iRDL vias. In some embodiments, an iRDL via is routed above a memory MAT that is located at an edge of a memory bank. As used herein, a "memory MAT" generally refers to a subunit of the memory bank having a plurality of memory cells. In other embodiments, iRDL vias may be routed above both an edge MAT and an adjacent column decoder. In other embodiments, iRDL vias may be routed above adjacent memory MATs.

Overview of Memory Architecture

Figure 1:
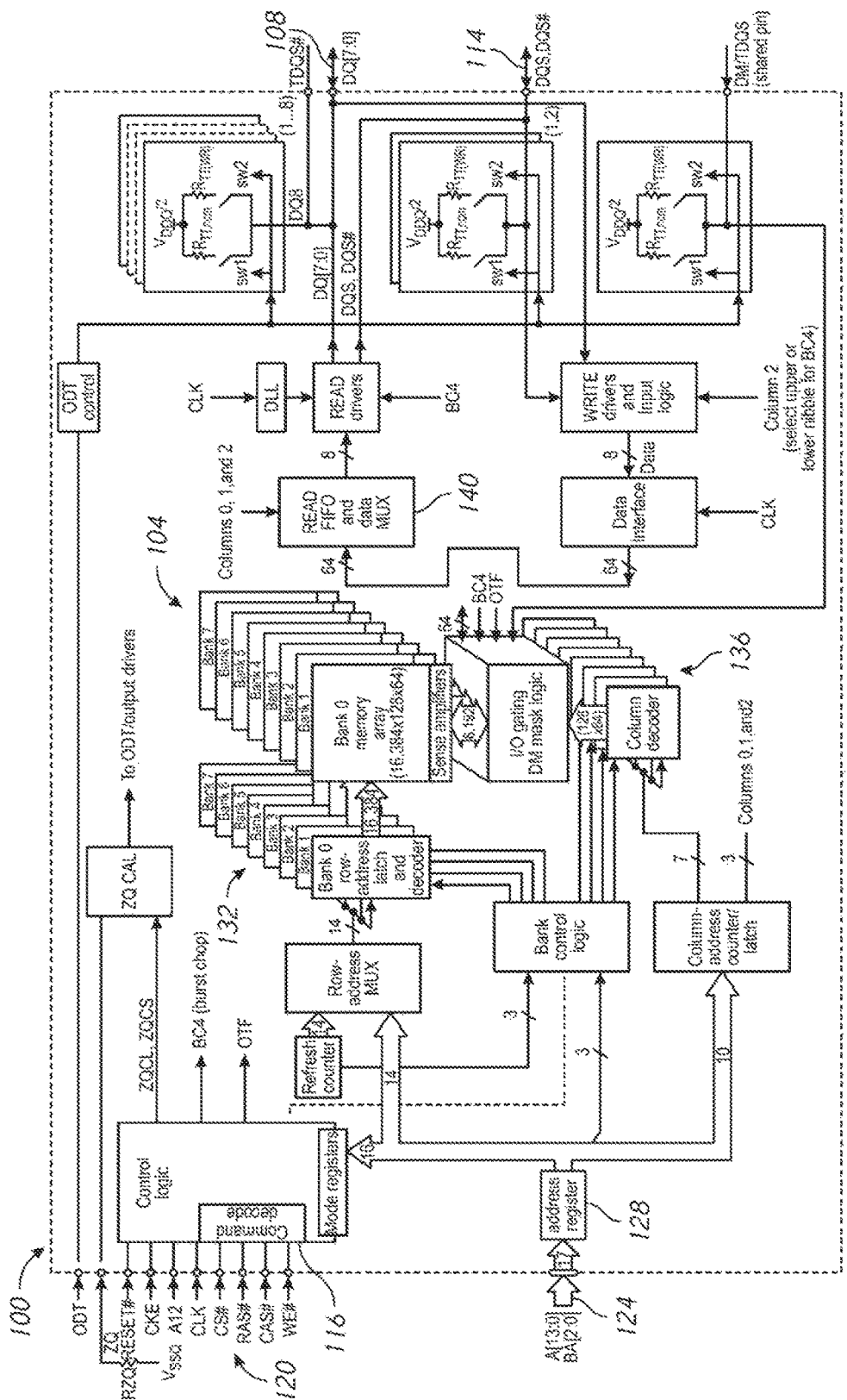
FIG. 1 is a schematic illustration of a portion of a memory in accordance with the present disclosure.

FIG. 1 is a schematic illustration of a portion of a memory 100 according to an embodiment of the present disclosure. The memory 100 includes an array 104 of memory cells, which may be, for example, DRAM memory cells, SRAM memory cells, flash memory cells, or some other type of memory cells. The memory 100 may be generally configured to operate in cooperation with a larger digital system that includes at least a processor configured to communicate with the memory 100. In the present description, "external" refers to signals and operations outside of the memory 100, and "internal" refers to signals and operations within the memory 100. As an illustrative example, the memory 100 may be coupled to a microprocessor that provides external commands and clock signals to the memory 100. Although examples in the present description are directed to synchronous memory devices, the principles described herein are equally applicable to other types of synchronous integrated circuits.

The memory 100 may be generally configured to execute read and/or write commands received from an external device. Read commands provide data stored in the array 104 to the external device across a data bus 108. Write co ands receive data from the external device across the data bus 108 and store the data in the memory array 104. The following discussion generally references read commands by way of example and not limitation. In processing a read command, the memory 100 receives an input clock signal CLK and generates an internal clock that synchronizes internal signals so as to provide output data on the data bus 108 with appropriate timing. Here, the memory device 100 uses a delay-locked loop 112 to synchronize internal signals including generating a data strobe signal 114. The data strobe signal 114 is provided as output to the external controller and is asserted at a time when the requested read data is available on the data bus 108 for capture by the external controller.

The memory system 100 includes a command decoder 116 that receives memory commands through a command bus 120. The command decoder 116 responds to memory commands applied to the command bus 120 by generating corresponding control signal to perform various operations on the memory array 104. For example, the command decoder 116 may generate internal control signals to read data from and/or write data to the memory array 104. Row and column address signals associated with a particular command are applied to the memory 100 through an address bus 124. The address bus 124 provides the row and column address signals to an address register 128. The address register 128 then outputs a separate column address and a separate row address to the memory array 104.

As can be seen in FIG. 1, row and column addresses may be provided by the address register 128 to a row address decoder 132 and a column address decoder 136, respectively. The column address decoder 128 selects bit lines extending through the array 104 corresponding to respective column addresses. The row address decoder 132 includes or is coupled to a word line driver or similar component that activates respective rows of memory cells in the array 104 corresponding to received row addresses. The selected data line (e.g., a bit line or bit lines) corresponding to a received column address are coupled to a read/write circuitry 140 to provide read data to a data output buffer or similar component via an input-output data bus 108. Write data is applied to the memory array 104 through a data input buffer or similar component and the memory array read/write circuitry 140.

The timing of signals external to the memory 100 may be determined by the external clock signal CLK. Operations within the memory 100 are typically synchronized to external operations. The delay-locked loop 112 is generally configured to receive the external clock signal CLK and generate a synchronized internal clock signal. The synchronized internal clock signal generated by the delay-locked look 112 may be provided to various internal memory components in order to facilitate the latching of command, address, and data signals in accordance with the external clock CLK. For example, data output may be placed on the data bus 104 of the memory 100 in synchronism with the external clock signal CLK so that the memory device 100 outputs data in a manner that allows the data to be captured by the external controller. To output data with proper timing, the delay-locked loop 112 develops an internal clock signal in response to the external clock signal and applies the internal clock signal to latches contained in the memory device 100 to clock data. The internal clock signal and external clock CLK are synchronized to ensure internal clock signal clocks the latches at the proper times to successfully capture the commands.

Figure 2:
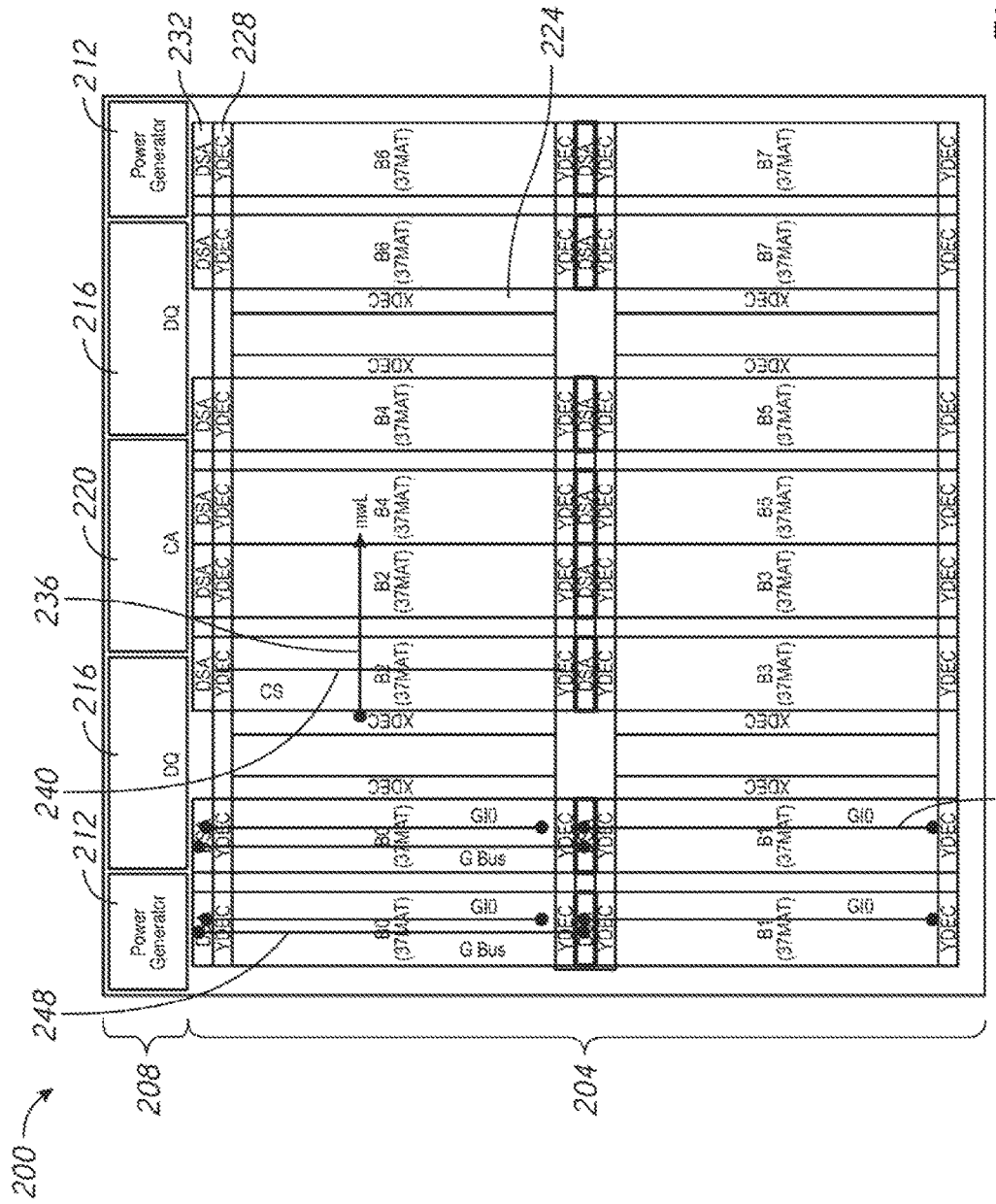
FIG. 2 is a schematic diagram that illustrates an example layout for a semiconductor memory device in accordance with the present disclosure.

FIG. 2 is a schematic diagram that illustrates an example layout for a semiconductor memory device 200 in accordance with the present disclosure. The semiconductor device 200 of FIG. 2 may correspond to the memory device of FIG. 1. Certain components that are illustrated in FIG. 1 are omitted from FIG. 2 in order to simply the drawing. FIG. 2 includes a memory area 204 and a peripheral circuit area 208. The memory area 204 may include a plurality of memory banks, which may correspond to the memory banks 104 illustrated in FIG. 1. The memory area 204 of FIG. 2 includes eight memory banks B0-B7, by way of example and not limitation. Among the memory banks B0 to B7 associated with the memory area 204, the even memory banks (B0, B2, B4, B6), which are half of the memory banks, are arranged in this order along an X-direction in a left half of the semiconductor chip in a Y-direction. The odd memory banks (B1, B3, B5, B7), which are the remaining half of the memory banks are arranged in this order along the X-direction in a right half of the semiconductor chip in the Y-direction.

The memory area 204 may be operatively coupled to various circuit components that are provided within the peripheral circuit area 208. The peripheral circuit area 208 may be positioned to one side of the memory area 204 in the Y-direction. The peripheral circuit area 208 may be a first pad area that is arranged along an edge of a semiconductor chip. Although not specifically shown in FIG. 2, memory array 200 may also be associated with a second peripheral circuit area that includes another pad area arranged along another edge of the semiconductor chip. The second peripheral circuit area may be arranged on an opposite side from the first peripheral circuit area 208. It should be appreciated that semiconductor devices having pad areas located at chip edges are shown and described herein by way of example and not limitation. Implementations consistent with the present disclosure may use alternative configurations. For example, in some implementations, a pad area may be provided at or near a center or midline of a semiconductor chip.

The peripheral circuit area 208 may include one or more power generator blocks 212, one or more DQ pad blocks 216, one or more column address blocks 220, and/or other components that are not specifically shown in FIG. 2. The DQ pad blocks 216 may include an input receiver that receives an address input via an address pin and an address latch circuit that latches the address. The DQ pad blocks 216 may also include an output buffer that outputs read data to a data I/O pin and/or an input receiver that receives write data supplied via the data I/O pin. The column address block 220 may include a column address decoder that selects bit lines extending through the memory area 204 corresponding to respective column addresses. A column address decoder of the column address block 220 may correspond to the column address decoder 128 of FIG. 1. The power generator block 212 may include a power source that supplies power to various circuit and components associated with the memory 200. The power generator block 220 may be provided in association with one or more transmission lines or other power distribution lines that supply power from the power distribution block 208 to the various components.

Each of the memory banks B0-B7 provided in the memory area 204 includes a plurality of memory cells organized into a plurality of memory MATs. A "memory MAT" generally refers to a subunit of the memory bank. The memory area 204 additionally includes one or more supporting components such as a row decoder (XDEC) 224 provided adjacently to one side of each of the memory banks B0 to B7 in the X-direction. Column decoders (YDEC) 228 and main amplifiers (DSA) 232 may be provided adjacently to a side of the memory area 204 in the Y-direction.

The row decoder 224 is a circuit that drives a plurality of word lines to select particular memory cells within the memory area 204 based on a row address. The row decoder 224 may be configured to drive one or more main word lines (MWL) 236, to which row decoders 224 may be directly coupled. For purposes of illustration, one main word line 236 is shown in FIG. 2. Although not shown in FIG. 2, the various main word lines 236 may be coupled to sub-word lines (SWL) that are arranged within the various memory MATs associated with the memory banks B0-B7. As described in greater detail below, this coupling may occur through various components that connect the main word lines 236 to the sub-word lines arranged within the various memory MATs.

The column decoder 228 is a circuit that selects a plurality of sense amplifiers contained in the memory cell area 204 on the basis of the column address. The column decoders 228 are coupled to the column address decoder 220, which may correspond to the column address decoder of 136 of FIG. 1. The column decoders 228 are configured to select a given plurality of sense amplifiers by driving column select (CS) 240 lines. FIG. 2 includes one column select line 240 by way of example and not limitation. The selected sense amplifiers are connected to the main amplifiers 232 via a global input/output lines (GIO) 244. The main amplifiers 232 are configured to transfer data between the DQ pads 216 and the adjacent memory bank B0-B7. The main amplifiers 232 are coupled to adjacent memory banks through the global input/ output lines 244. The main amplifiers 232 are coupled to the DQ pads 216 through a global bus (GBUS) 248. FIG. 2 includes two global input/output lines 244 and one global bus 248 by way of by way of example and not limitation.

Figure 3:
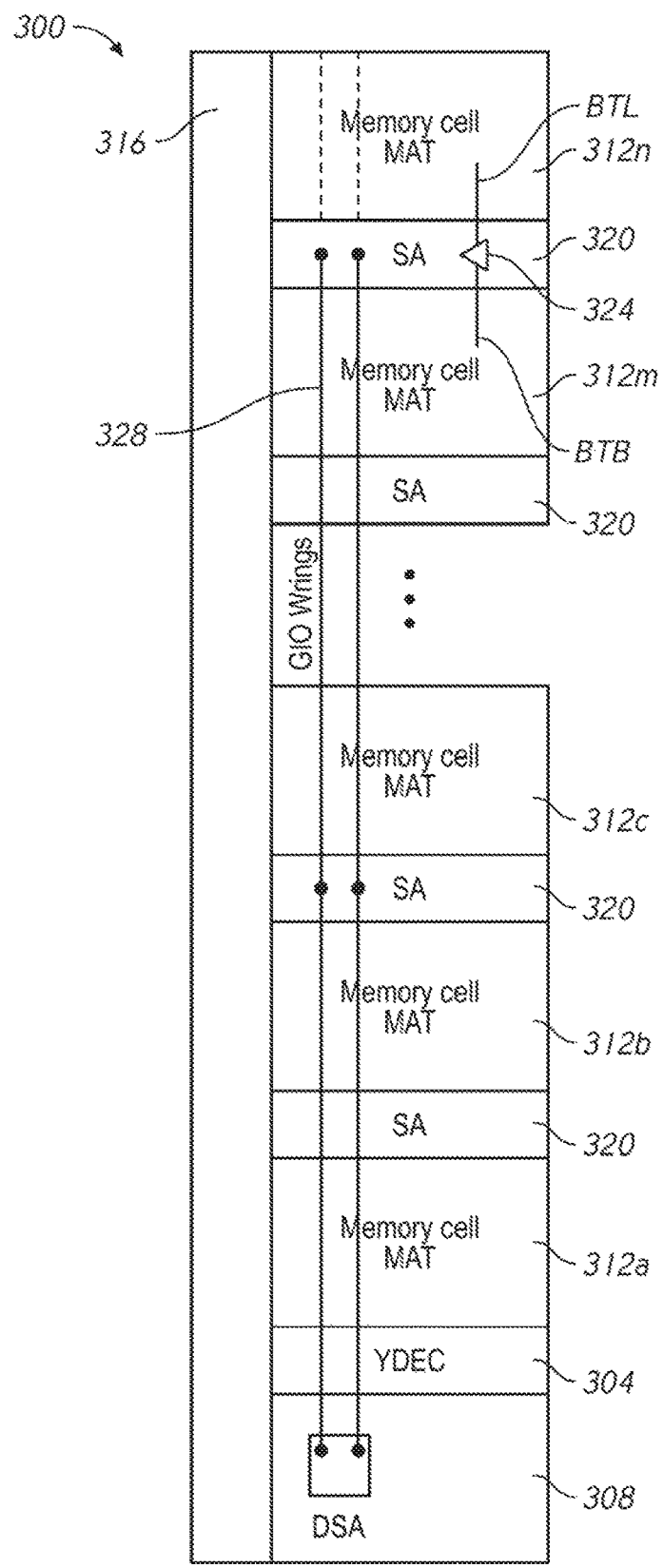
FIG. 3 is a schematic diagram that illustrates the configuration of an example memory bank for the semiconductor memory device of FIG. 2.

FIG. 3 is a schematic diagram that illustrates the configuration of an example memory bank 300. The example memory bank of FIG. 3 may correspond to one of the memory banks B0-B7 illustrated in FIG. 2. The memory bank 300 may include a column decoder (YDEC) 304 and a main amplifier (DSA) 308. The column decoder 304 may correspond to the column decoder 228 of FIG. 2. The main amplifier 308 may correspond to the main amplifier 232 of FIG. 2. The memory bank 300 may include a plurality of memory mats MAT 312a-n (collectively memory MATs 312) arranged along the Y-direction. An adjacent circuit area 316 may be provided adjacent to the memory mats MAT 312 in the X-direction. The adjacent circuit area 316 may include a number of supporting components that are described in greater detail in connection with FIG. 4. A sense amplifier area (SAA) 320 may be provided between two memory MATs 312 that are adjacent to each other in the Y-direction.

The sense amplifier area 320 may include a plurality of sense amplifiers 324. FIG. 3 shows one sense amplifier 324 by way of example and not limitation. In some embodiments as shown in FIG. 3, a sense amplifier 324 may be coupled to a pair of bit lines BLT and BLB. A memory device in accordance with the present disclosure having such a configuration may be understood as having an open bit-line structure or architecture. Here, bit lines BLT and BLB included in a bit line pair connected to one sense amplifier 324 may be arranged in different memory mats MAT (that is, two memory mats MAT that are adjacent to each other in the Y-direction), respectively.

Memory MAT 312a and memory MAT 312n, which positioned in the Y-direction end portions, are so-called end mats. The memory mats MAT 312a and MAT 312n only have half the number of bit lines of the other memory mats MATb to MATm. Therefore, even though N memory mats are arranged in the Y-direction, the capacity value is that of N−1 mats. As for both the end mats MAT 312a and MAT 312n, a sense amplifier area 320 is provided only on one Y-direction side. Therefore, the number of bit lines BL provided is one-half of the number of bit lines of a normal memory mat (e.g. MAT 312b) in which sense amplifier areas 320 are provided on both sides.

A sense amplifier 324 amplifies a potential difference generated in pairs of the bit lines BLT and BLB. Read data amplified by the sense amplifier 324 is transferred to local input/output lines LIO (described below in connection with FIG. 4), and then further transferred to the global input/output lines (GIO) 328. A main amplifier 308 may be coupled to sense amplifiers 324 in the sense amplifier area 320 via the global input-output lines 328 and components coupled to the global input/output lines 328. As shown in FIG. 2, a main amplifier 232 may couple global input/output lines 244 to a global bus 248, which, in turn, couples to a DQ pad 216.

FIG. 3 shows that a global input/output lines 328 may be laid out in the Y-direction over one or more of the memory MATs 312 and over one or more of the sense amplifier areas 320. A number of global input/output lines 328 extending in the Y-direction may be provided in parallel to each other and may be connected to the main amplifier 308. Although not specifically shown in FIG. 3, local input/output lines may extend in the X-direction, perpendicular to the global input/ output lines 328 that extend in the Y-direction. The coupling between and among local input/output lines, sense amplifiers 324, and global input/output lines 328 may be understood with reference to FIG. 4.

Figure 4:
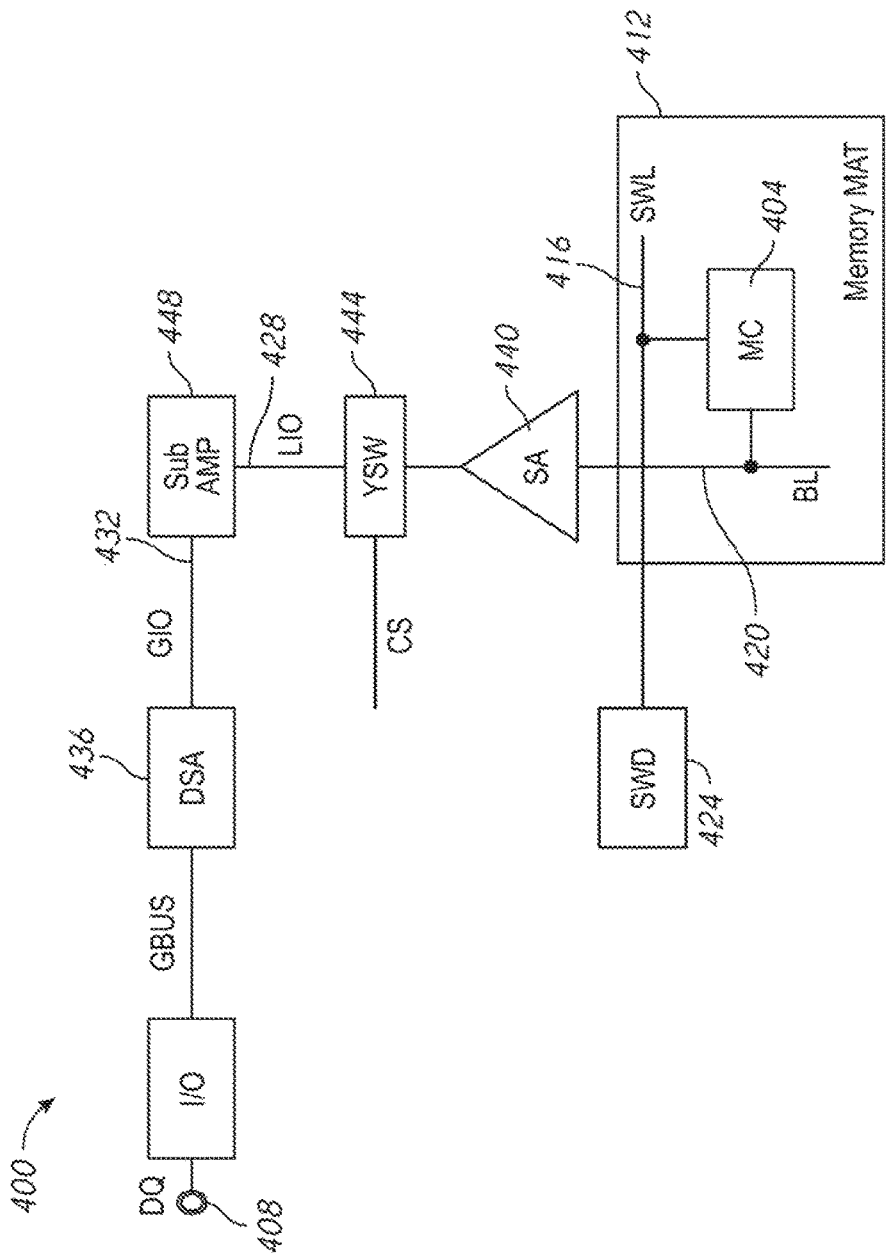
FIG. 4 is a schematic diagram that illustrates a data path for the semiconductor memory device of FIG. 2.

FIG. 4 is a schematic diagram that illustrates a data path 400 that provides for transfer of data between an individual memory cell (MC) 404 and a DQ pad 408. The memory cell 404 may be one of a plurality of memory cells that are arranged in a grid pattern within a memory MAT 412. The memory MAT 412 may correspond to one of the memory MATs 312 that are illustrated in FIG. 3. As shown in FIG. 4, the memory mat 412 is an area in which sub-word lines (SWL) 416 and bit lines (BT) 420 extend. In a memory MAT 412, memory cells 404 are arranged at respective intersections of sub-word lines 416 extending in the X-direction and bit lines 420 extending in the Y-direction. A memory cell 404 may have a configuration in which a cell transistor and a cell capacitor are connected in series between a corresponding one of the bit lines 420 and a plate wiring (such as a pre-charge line). The cell transistor may include an n-channel MOS transistor, and a gate electrode thereof may be connected to a corresponding one of the sub-word lines 416.

A sub-word line 416 associated with the memory mat 412 may be driven by a sub-word driver (SWD) 424. FIG. 4 includes one sub-word driver 424 by way of example and not limitation. Each of the sub-word drivers 424 drive a corresponding one of the sub-word lines 416 according to the row address. As described above in connection with FIG. 2 and FIG. 3, the row address is provided by a row decoder XDEC, which drives the row address onto main word lines (MWL). The sub-word drivers 424 provide a coupling between the main word lines (MWL) and the sub-word lines (SWL) and in so doing drive sub-word lines 416 with appropriate signals responsive to the row address provided by the row decoder (XDEC). One or more sub-word drivers 424 may be located in the adjacent circuit area 316, which is illustrated in FIG. 3. FIG. 2 shows an example main word line 236, which provides input to one or more sub-word drivers 424.

The data path 400 shown in FIG. 4 additionally includes an example local input/output line (LIO) 428 and an example global input/output line (GIO) 432. The local input/output lines 428 and the global input/output lines 432 are hierarchically structured input/output lines. The local input/output line 428 is used for transferring read data out from a memory cell 404 and/or write data to the memory cell 404. The local input/output line 428 may be differential data input/output lines for transferring read data and write data by using a pair of lines. The global input/output lines 432 are used for transferring data between the main amplifier (DSA) 436 and the various memory MATs of a particular memory bank, which memory bank includes the memory MAT 412 shown in FIG. 4. Thus, the global input/output lines 432 are used for transferring data from the memory bank to the main amplifier 436 and transferring write data from the main amplifier 436 to the memory bank. The global input/output lines 432 may also be differential data input/output lines for transferring read data and write data by using a pair of lines.

The data path 400 shown in FIG. 4 illustrates various components that are proximate to the memory MAT 412 and that facilitate transfer of data between the memory cell 404 and the local input/output line 428. A sense amplifier 440 is coupled to the memory cell 404 via the bit line 420. The sense amplifier 440 is configured to transfer data between the bit line 420 and the local input/output lines 428 via a column switch (YSW) 444. The column switch 444 may be driven by a column select CS line (FIG. 2) that enables a particular sense amplifier 440 to transfer its data onto the local input output lines 428. The local input lines 428 are received as input at a sub-amplifier (Sub Amp) 448. The sub-amplifier 448 is generally configured to transfer data between the local input/output lines 428 and the global input/output lines 432. One or more column switches 444 may be located in the sense amplifier area 320, which is illustrated in FIG. 3. One or more sub-amplifiers 448 may be located in the adjacent circuit area 316, which is illustrated in FIG. 3.

Redistribution Layer

Referring again to FIG. 2, a memory device 200 in accordance with the present disclosure may include a power generator block 220 that provides power to various components located in the memory area 204 of the memory device 200. In this regard, the power generator blocks 220 may be provided in association with one or more transmission lines or other power distribution lines that supply power to the various memory device 200 components. One example of such a power distribution line is the iRDL line. As used herein, "iRDL" refers a redistribution layer formed in a semiconductor process before assembly process. In some cases, an iRDL line is in a metal 4 layer (M4) over a metal 3 layer (M3). An iRDL line may be provided in an uppermost layer, which may be the lowest resistivity layer in the device. An example of such an iRDL line is illustrated in FIG. 5.

Figure 5:
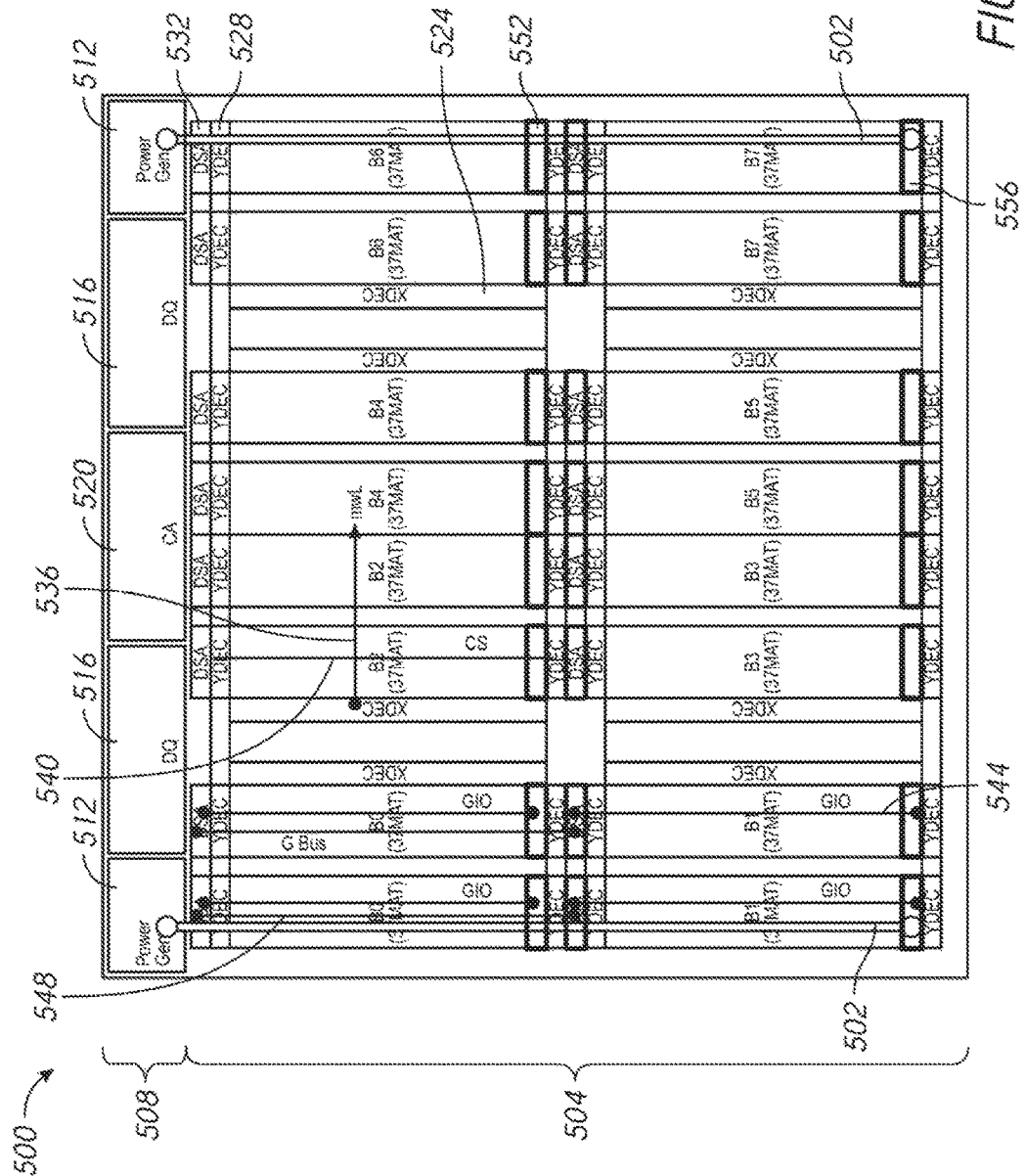
FIG. 5 is a schematic diagram that illustrates an example layout for a memory device in accordance with the present disclosure.

FIG. 5 is a schematic diagram that illustrates an example layout for a memory device 500 in accordance with the present disclosure. The memory device 500 of FIG. 5 may correspond to the memory device of FIG. 2. Thus, the memory device 500 includes memory area 504 and a peripheral circuit 508 area. The memory area 504 may include a plurality of memory banks B0-B7, where a left side of the memory area 504 includes even-numbered memory banks (B0, B2, B4, B6) and a right side of the memory area 504 includes odd-numbered (B1, B3, B5, B7) memory banks. The peripheral circuit 508 area may include various circuit components such as one or more power generators 512, one or more DQ pads 516, and/or one or more column address blocks 520. Within the memory area 504, the memory device additionally includes row decoders (XDEC) 524 that drive main word lines) (MWL) 536, column decoders (YDEC) 528 that drive column select (CS) lines 540, and main amplifiers (DSA) 532 that provide coupling between global input/output lines (GIO) 544 and global buses (GBUS) 548.

In order to reduce power dissipation and heating issues associated with power distribution, the memory device may include a redistribution layer that includes low resistivity lines that provide power to certain locations within the device. This layer may be referred to as an "iRDL layer" and may contain "iRDL lines." The iRDL layer be formed in a semiconductor process that occurs before an assembly process. An iRDL layer may be an uppermost layer of the device, which may be the lowest resistivity layer in the device. In some cases, an iRDL layer is a metal 4 layer (M4) over the metal 3 layer (M3). The memory device 500 of FIG. 5 includes example iRDL lines 502 that are coupled to the power generator blocks 520. FIG. 5 show two iRDL lines 502 by way of example and not limitation. It should be appreciated a memory device 500 in accordance with the present disclosure may include more or less iRDL lines 502 depending on the implementation.

In order for power from the iRDL lines 502 to be provided to various memory device 500 components, the memory device 500 may include one or more vias that provide conductive pathways between various layers of the memory device 500. Continuing with the example above where the iRDL lines are routed in a metal 4 layer, the memory device 500 may include one or more M4-M3 vias that provide a conductive pathways between the metal 4 layer and a metal 3 layer. Using the one or more M4-M3 vias, power may be, provided from the iRDL lines 502 to components in the metal 3 layer. In some cases, the metal 3 layer may contain a network of power distribution lines that distribute power to various points in the memory device 500. Components that consume the power provided by this power distribution network may have power input couplings that are located in lower device layers, such as a metal 2 layer (M2). Thus, a memory device 500 may additionally include M3-M2 vias that provide a conductive pathways between the metal 3 layer and the metal 2 layer.

In determining locations for vias between layers of the memory device 500, consideration is given to the location of other components that are located in, the various device layers. For example, the metal 3 layer may include wiring that implements various signal lines such as the input/output lines (GIO) 544, global buses (GBUS) 548, and/or various control signal lines for components such as the column decoder 528, the main amplifier 532, and so on. Thus, an M4-M3 via that provides a conductive pathway between the metal 4 layer and the metal 3 layer may be placed in an area of the memory device 500 that is otherwise free of signal wirings in the metal 3 layer. Such an M4 M3 via may provide a coupling between the iRDL lines 502 and a network of power distribution lines that distribute power to various points in the memory device 500. This power distribution network may also couple to power lines or couplings that are located in the metal 2 layer. Accordingly, the memory device 500 may also include M3-M2 vias that may or may not be located proximate to the M4-M3 vias. In determining locations for the M3-M2 vias, consideration is given to the location of other wiring and components in the metal 2 layer. One example of a wiring that may be present in the metal 2 layer is the main word lines (MWL) 536 that are driven by the row decoders (XDEC) 524.

Conventionally, a memory device includes a dedicated area for routing of iRDL vias. These dedicated areas are used to avoid interference with control signals or other wiring that may be present in areas that underlie the redistribution layer. These dedicated areas result in unwanted increases in chip size, power consumption and other disadvantages. Embodiments of the present disclosure avoid conventional arrangements that include a dedicated iRDL layout region. In this regard, present embodiments may route iRDL vias in device locations that lack certain metal layer wirings, but contain other device components such that the iRDL via routing area is not exclusively dedicated to iRDL vias. Continuing with the example above where the iRDL layer is routed in a metal 4 layer, a memory device in accordance with present embodiments may include one or more M4-M3 vias that provides conductive pathways between iRDL lines and a power distribution network that is located at least partially in the metal 3 layer. The memory device may additionally include one or M3-M2 vias that further distribute power to lower layers of the power distribution network.

iRDL Vias Over Edge MATs

FIG. 5 provides a first example of a memory device 500 in accordance with the present disclosure that routes iRDL vias in device locations that lack certain metal layer wirings, but contain other device components such that the iRDL via routing area is not exclusively dedicated to iRDL vias. More specifically, the memory, device 500 of FIG. 5 routes iRDL vias above an edge MAT. As discussed in connection with FIG. 3, a memory mat MAT that is positioned at one end of a column of memory MATs is referred to as an "edge MAT." An edge MAT typically has half the memory capacity as it is typically associated with only one sense amplifier area (SSA). FIG. 3 shows a plurality of memory MATs 312a-n, including a first edge MAT 312a and a second edge MAT 312n. The first edge MAT 312a is the closest edge MAT to the main amplifier 308. The second edge MAT 312n is the farthest edge MAT from the main amplifier 308. FIG. 3 also shows global input/output lines 328 that are laid out in the Y-direction over one or more of the memory MATs 312 and over one or more of the sense amplifier areas 320. As can be seen in FIG. 3, the global input/output lines 328 extend over all of the memory MATS except for the second edge MAT 312n that is farthest from the main amplifier 308. It is this area, the area over the edge MAT farthest from the main amplifier (DSA), that an iRDL via may be routed in accordance with an embodiment of the present disclosure.

In FIG. 5, iRDL routing areas located in the even number memory banks (B0, B2, B4, B6) are generally indicated with reference number 552. An iRDL routing area 552 generally corresponds to an edge MAT (and the sense amplifier area (SAA) associated with the edge MAT) that is located farthest from the main amplifier 532 associated with the memory bank to which the edge MAT belongs. As can be seen in FIG. 5 (and more particularly in FIG. 3), global input/output lines 544 are not located in this iRDL routing area 552. Because the iRDL routing area 552 lacks global input/output lines 544 or other metal 3 layer wiring at least in certain areas, one or more iRDL vias may be routed in the iRDL routing area 552. The routing of these one or more iRDL vias may be understood with reference to FIG. 6 which includes an enlarged view of an iRDL routing area 552.

Figure 6:
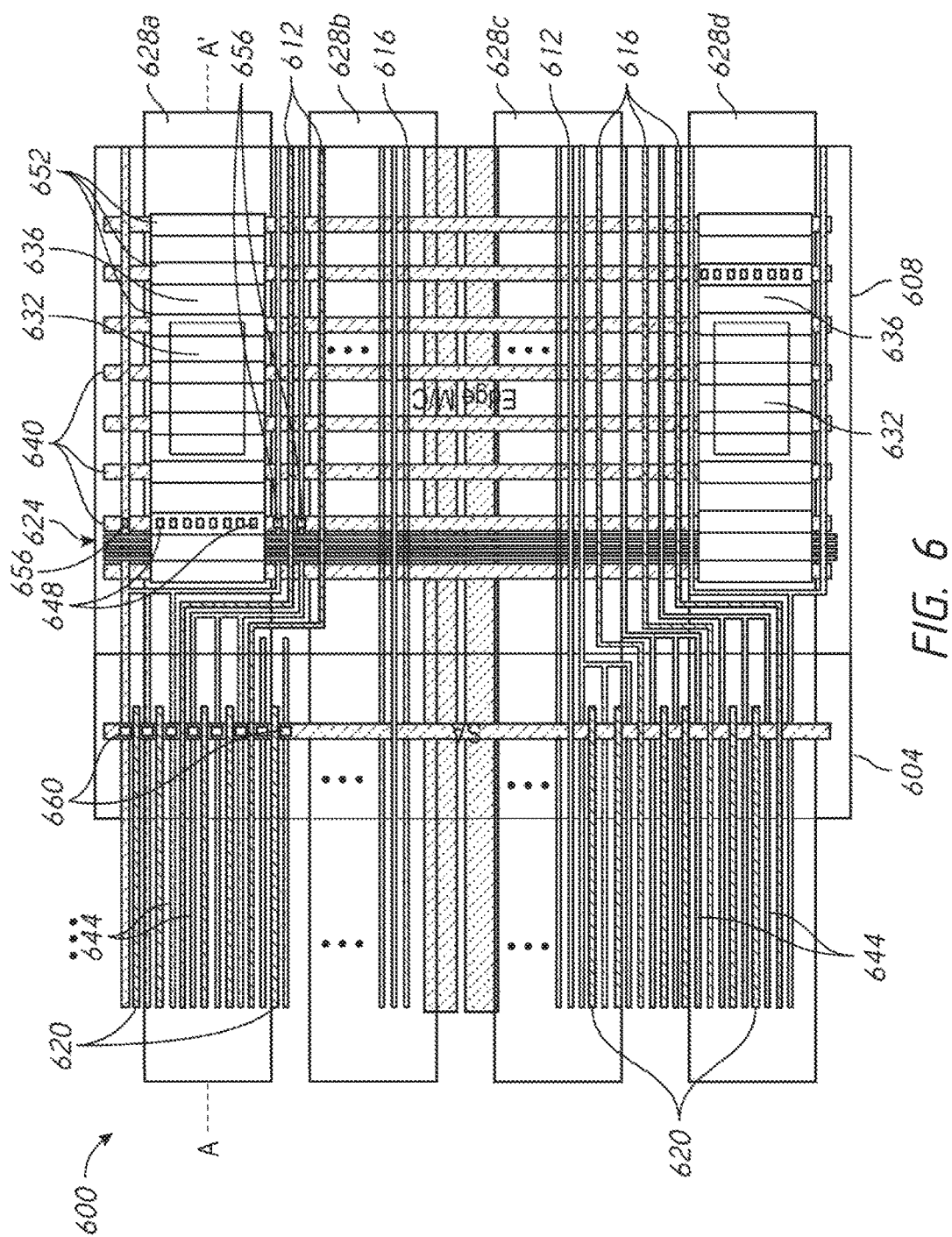
FIG. 6 is a plan view schematic diagram of a via routing area shown in FIG. 5.

FIG. 6 is a plan view schematic diagram of an iRDL routing area 600. The iRDL routing area 600 may correspond to the iRDL routing area 552 of FIG. 5. The iRDL routing area 600 includes a sense amplifier area 604 and edge MAT 608. Global bus lines 612 extend in the Y-direction across both the sense amplifier area 604 and the edge MAT 608. Control signals 616, such as for a column decoder (YDEC) and/or a main amplifier (DSA), extend in the Y-direction across both the sense amplifier area 604 and the edge MAT 608. Global input/output (GIO) lines 620 extend in the Y-direction, but end at the sense amplifier area 604 such that they do not extend into the edge MAT 608 area. Main word lines (MWL) 624 extend across the edge MAT 608 in the X-direction. The global bus lines 612, the control signal lines 616, and the global input/output lines 620 may be routed in a metal 3 layer. The main word lines 624 may be routed in a metal 2 layer.

FIG. 6 additionally includes iRDL lines 628a-d that extend in the Y-direction across both the sense amplifier area 604 and the edge MAT 608. FIG. 6 includes four iRDL lines 628a-d (collectively iRDL lines 628) by way of example and not limitation. As discussed in connection with FIG. 5, an iRDL line may be coupled to a power generator block and may be configured to distribute power to various points within a memory device. The iRDL lines 628 of FIG. 6 include two outer iRDL lines 628a,d and two inner iRDL lines 628b,c. The iRDL lines 628 may be routed in a metal 4 layer.

The iRDL lines 828 may provide power to a power distribution network that is disposed in metal layers that underlie the metal layer of the iRDL, line (M4 in one example). In order for power to be provided from the iRDL lines 628 to the lower metal layers, the memory device may include vias that provide conductive pathways between various metal layers. iRDL vias (M4-M3 vias) 632 may provide coupling between the iRDL lines 628 and portions of the power distribution network that are boated in the metal 3 layer. In the embodiment of FIG. 6, the iRDL vias 632 are located above the edge MAT 608 in areas that lack global input/output lines 620 or other M3 wiring. As shown in FIG. 6, the area above the edge MAT 608 and below the two outer iRDL, lines 628*a,d* lacks global input/output lines 620 or other M3 wiring, while the area above the edge MAT 608 and below the two inner iRDL lines 628*b,c* includes M3 wiring such as the global bus lines 612 and the control signal lines 616. Thus, in the embodiment of FIG. 6, the iRDL vias 632 are located in the area above the edge MAT 608 and below the two outer iRDL lines 628*a,d*.

As shown in FIG. 6, the iRDL vias 632 may be coupled to power distribution nodes 636 that are coupled to various power distribution wires. First power distribution wires 640 may be located in the metal 3 layer. First power distribution wires 640 may be arranged in the X-direction and may be configured to distribute power to the memory bank associated with memory MAT 604, as well as to memory banks that are adjacent in the X-direction. Second power distribution wires 644 may be located in the metal 2 layer. The second power distribution wires 644 may be generally arranged in the Y-direction and configured to transmit power from the first power distribution wires 640 to components that are located adjacently in the Y-direction. For example, the second power distribution wires 644 may transmit power from the first power distribution wires 640 to sense amplifiers are that located in the sense amplifier area 604.

The power distribution network of FIG. 6 may additionally include M3-M2 vias that provide conductive pathways between components and wires in the metal 3 layer and the metal 2 layer. A first group of M3-M2 vias 648 provide a conductive pathway between the distribution nodes 636 and the first power distribution wires 640. FIG. 6 shows M3-M2 vias 648 between the distribution nodes 636 and particular first power distribution wires 640 by way of example and not limitation. In alternative embodiments, M3-M2 vias 648 may be provided between the distribution nodes 636 and any of the first power distribution wires 640 shown in FIG. 6. Possible M3-M2 vias 648 routing locations are generally indicated in FIG. 6 by enclosed areas 652. A second group of M3-M2 vias 656 provide a conductive pathway between the first power distribution wires 640 and the second distribution wires 644. A third group of M3-M2 vias 660 provide a conductive pathway between the second distribution wires 644 and components in the sense amplifier area 604.

Figure 7:
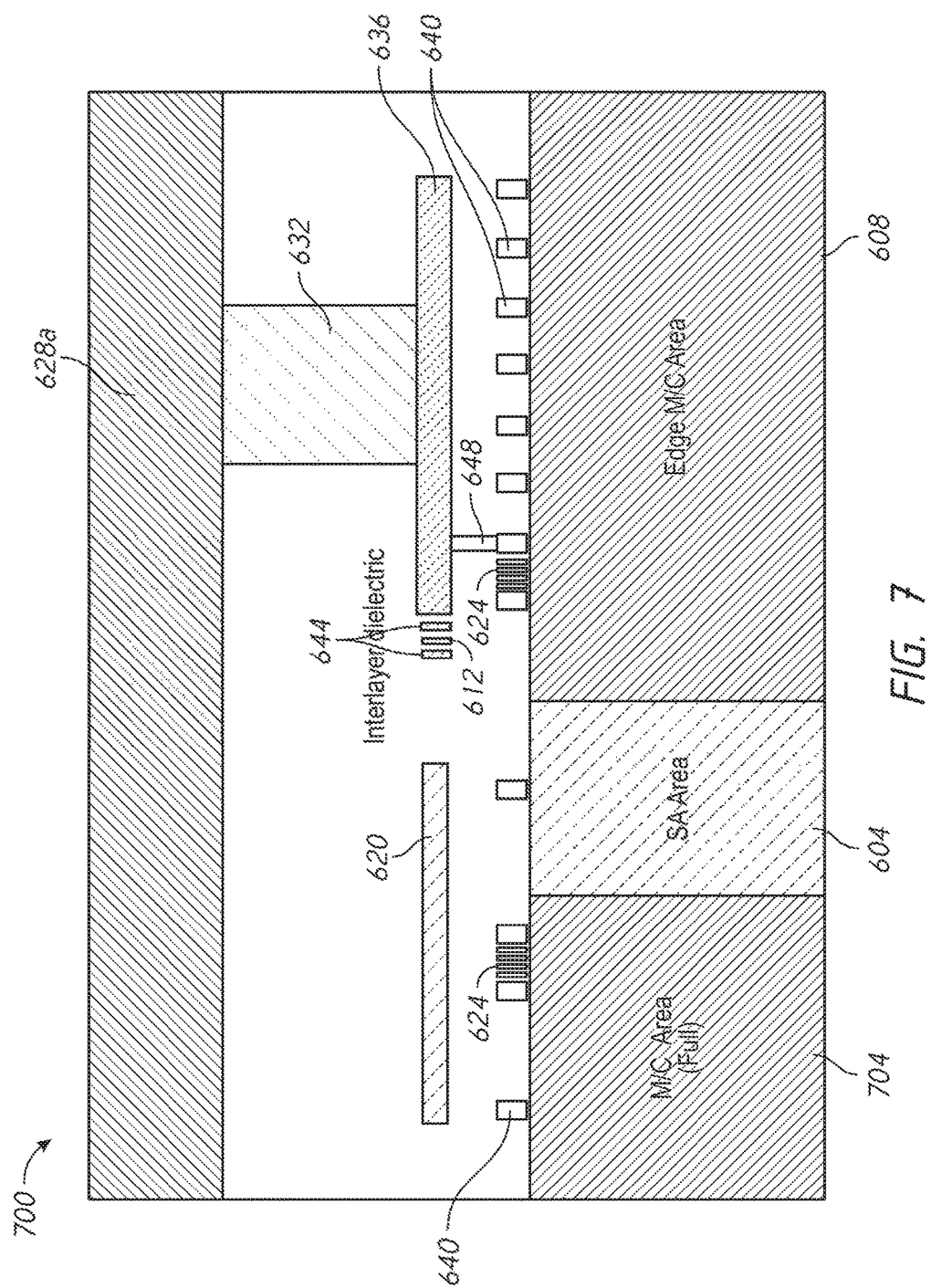
FIG. 7 is a cross-sectional view of the via routing area shown in FIG. 6.

FIG. 7 is a cross-sectional view of the iRDL routing area 600 of FIG. 6. The cross section 700 of FIG. 6 is taken with respect to the A-A line shown in FIG. 6. FIG. 7 is given to provide a greater understanding of the relationship between the components discussed in FIG. 6. FIG. 7 includes a cross-sectional view of the sense amplifier area 604 and the edge MAT 608. FIG. 7 also shows a portion of a full memory MAT 704 that is located on the opposite side of the sense amplifier area 604 from that of the edge MAT 608. Additionally, FIG. 7 includes cross-sectional portions of an outer iRDL line 628*a*, a power distribution node 636, first power distribution wires 640, second power distribution wires 644, global bus lines 612, global input/output lines 620, and main word lines 624. It should be noted that the second power distribution wires 644 and global bus lines 612 are generally configured to run in the Y-direction, but the cross-sectional view of FIG. 7 captures a small portion of those lines that run in the X-direction. As show in FIG. 7, the iRDL line 628*a* is routed in the metal 4 layer. The power distribution node 636, the second power distribution wires 644, the global bus lines 612, and the global input/output lines 620 are routed in the metal 3 layer. The first power distribution wires 640 and the main word lines 624 are routed in the metal 2 layer. FIG. 7 also shows an iRDL via 632 that couples the iRDL line 628*a* to the power distribution node 636 and a first M3-M2 via 648 that couples the distribution node 636 to a first power distribution wire 640. The second and third groups of M3-M2 656, 660 are outside of the A-A cross section and thus not shown in FIG. 7.

Referring again to FIG. 5, the memory device 500 additionally includes iRDL routing areas located in odd numbered memory banks (B1, B3, B5, B7). iRDL routing areas located in the odd number memory banks (B1, B3, B5, B7) are generally indicated with reference number 556. An iRDL routing area 556 generally corresponds to an edge MAT (and the sense amplifier area (SAA) associated with the edge MAT) that is located farthest from the main amplifier 532 associated with the memory bank to which the edge MAT belongs. As can be seen in FIG. 5 (and more particularly in FIG. 3), global input/output lines 544 are not located in this iRDL routing area 556. Additionally, global bus lines 548 are not located in this iRDL routing area 556. Because the iRDL routing area 556 lacks global input/output lines 544, global bus lines 548 or other metal 3 layer lines at least in certain areas, one or more iRDL vias may be routed in the iRDL routing area 556. The routing of these one or more iRDL vias may be understood with reference to FIG. 8 which includes an enlarged view of an iRDL routing area 556.

Figure 8:
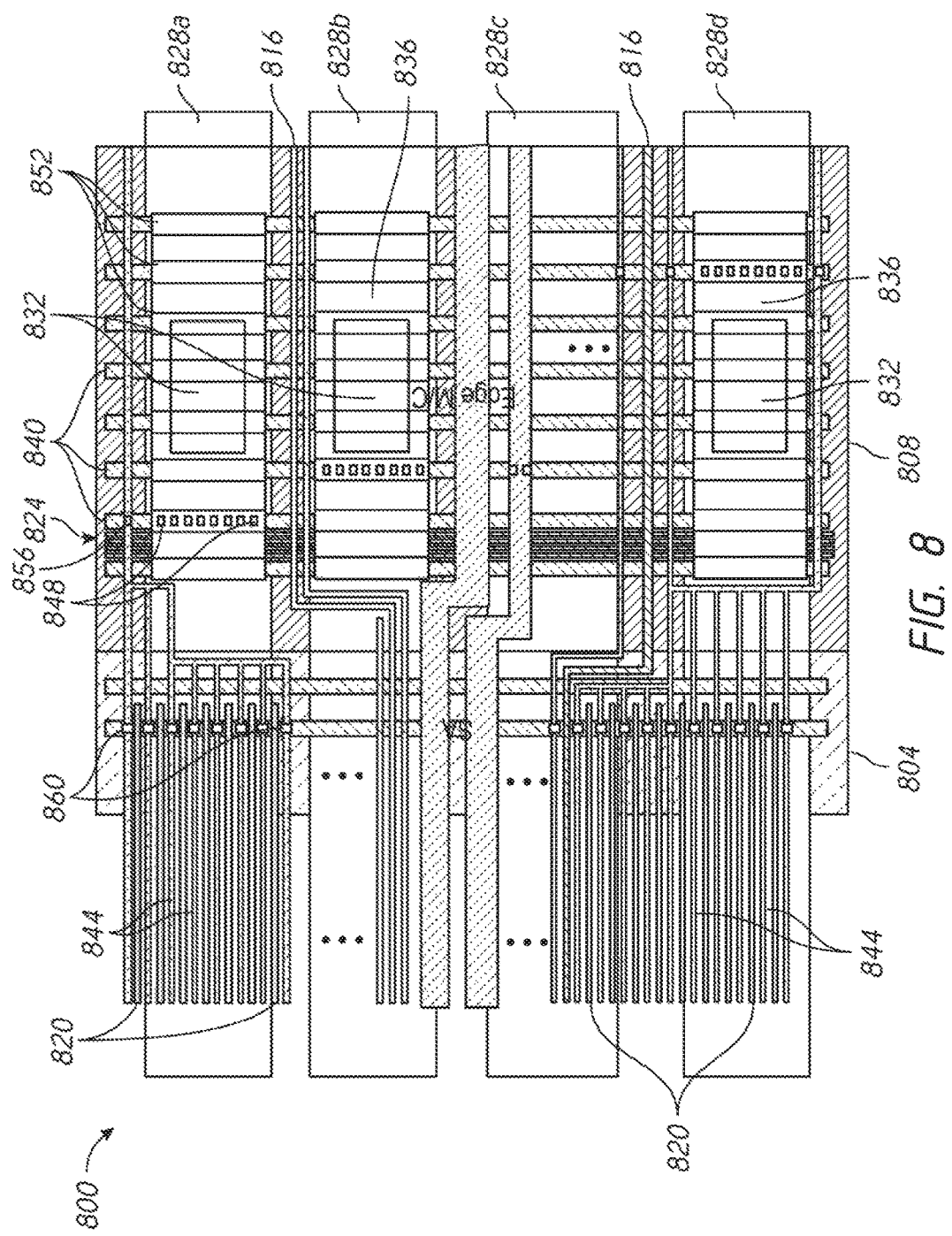
FIG. 8 is a plan view schematic diagram of another via routing area shown in FIG. 5.

FIG. 8 is a plan view schematic diagram of an iRDL routing area 800. The iRDL routing area 800 may correspond to an iRDL routing area 556 of FIG. 5 The iRDL routing area 800 includes a sense amplifier area 804 and edge MAT 808. Control signals 816, such as for a column decoder (YDEC) and/or a main amplifier (DSA), extend in the Y-direction across both the sense amplifier area 804 and the edge MAT 808. Global input/output (GIO) lines 820 extend in the Y-direction, but end at the sense amplifier area 804 such that they do not extend into the edge MAT 808. Main word lines (MWL) 824 extend across the edge MAT 808 in the X-direction. The control signal lines 816, and the global input/output lines 820 may be routed in a metal 3 layer. The main word lines 824 may be routed in a metal 2 layer.

FIG. 8 additionally includes iRDL lines 828*a-d* that extend in the Y-direction across both the sense amplifier area 804 and the edge MAT 808. FIG. 8 includes four iRDL lines 828*a-d* (collectively iRDL lines 828) by way of example and not limitation. As discussed in connection with FIG. 5, an iRDL line may be coupled to a power generator block and may be configured to distribute power to various points within a memory device. The iRDL lines 828 of FIG. 8 include two outer iRDL lines 828*a,d* and two inner iRDL lines 828*b,c*. The iRDL lines 828 may be routed in a metal 4 layer.

The iRDL lines 828 may provide power to a power distribution network that is disposed in metal layers that underlie the metal layer of the iRDL line (M4 in one example). In order for power to be provided from the iRDL lines 828 to the lower metal layers, the memory device may include vias that provide conductive pathways between various metal layers. iRDL vias (M4-M3 vias) 832 may provide coupling between the iRDL lines 828 and portions of the power distribution network that are located in the metal 3 layer, in the embodiment of FIG. 8, the iRDL vias 832 are located above the edge MAT 808 in areas that lack global input/output lines 820 or other M3 wiring. As shown in FIG. 8, the area above the edge MAT 808 and below the two outer iRDL lines 828a,d lacks global input/output lines 820 or other M3 wiring. Additionally, the area above the edge MAT 808 and below one inner iRDL lines 828b also lacks global input/output lines 820 or other M3 wiring, while the area above the edge MAT 808 and below other inner iRDL lines 828c includes M3 wiring such as the control signal lines 816. Thus, in the embodiment of FIG. 8, the iRDL vias 832 are located in the areas above the edge MAT 808 and below the two outer iRDL lines 828a,d and the above the edge MAT 808 and below one inner iRDL lines 828b.

As shown in FIG. 8, the iRDL vias 832 may be coupled to power distribution nodes 836 that are coupled to various power distribution wires. First power distribution wires 840 may be located in the metal 3 layer. First power distribution wires 840 may be arranged in the X-direction and may be configured to distribute power to the memory bank associated with memory mat 804, as well as to memory banks that are adjacent in the X-direction. Second power distribution wires 844 may be located in the metal 2 layer. The second power distribution wires 844 may be generally arranged in the Y-direction and configured to transmit power from the first power distribution wires 840 to components that are located adjacently in the Y-direction. For example, the second power distribution wires 844 may transmit power from the first power distribution wires 840 to sense amplifiers are that located in the sense amplifier area 804.

The power distribution network of FIG. 8 may additionally M3-M2 vias that provide conductive pathways between components and wires in the metal 3 layer and the metal 2 layer. A first group of M3-M2 vias 848 provide a conductive pathway between the distribution nodes 838 and the first power distribution wires 840. FIG. 8 shows M3-M2 vias 848 between the distribution nodes 836 and particular first power distribution wires 840 by way of example and not limitation. In alternative embodiments, M3-M2 vias 848 may be provided between the distribution nodes 836 and any of the first power distribution wires 840 shown in FIG. 8. Possible M3-M2 vias 848 routing locations are generally indicated in FIG. 8 by enclosed areas 852. A second group of M3-M2 vias 856 provide a conductive pathway between the first power distribution wires 840 and the second distribution wires 844. A third group of M3-M2 vias 860 provide a conductive pathway between the second distribution wires 844 and components in the sense amplifier area 804.

iRDL Vias Over Edge MATs and Column Decoders

Figure 9:
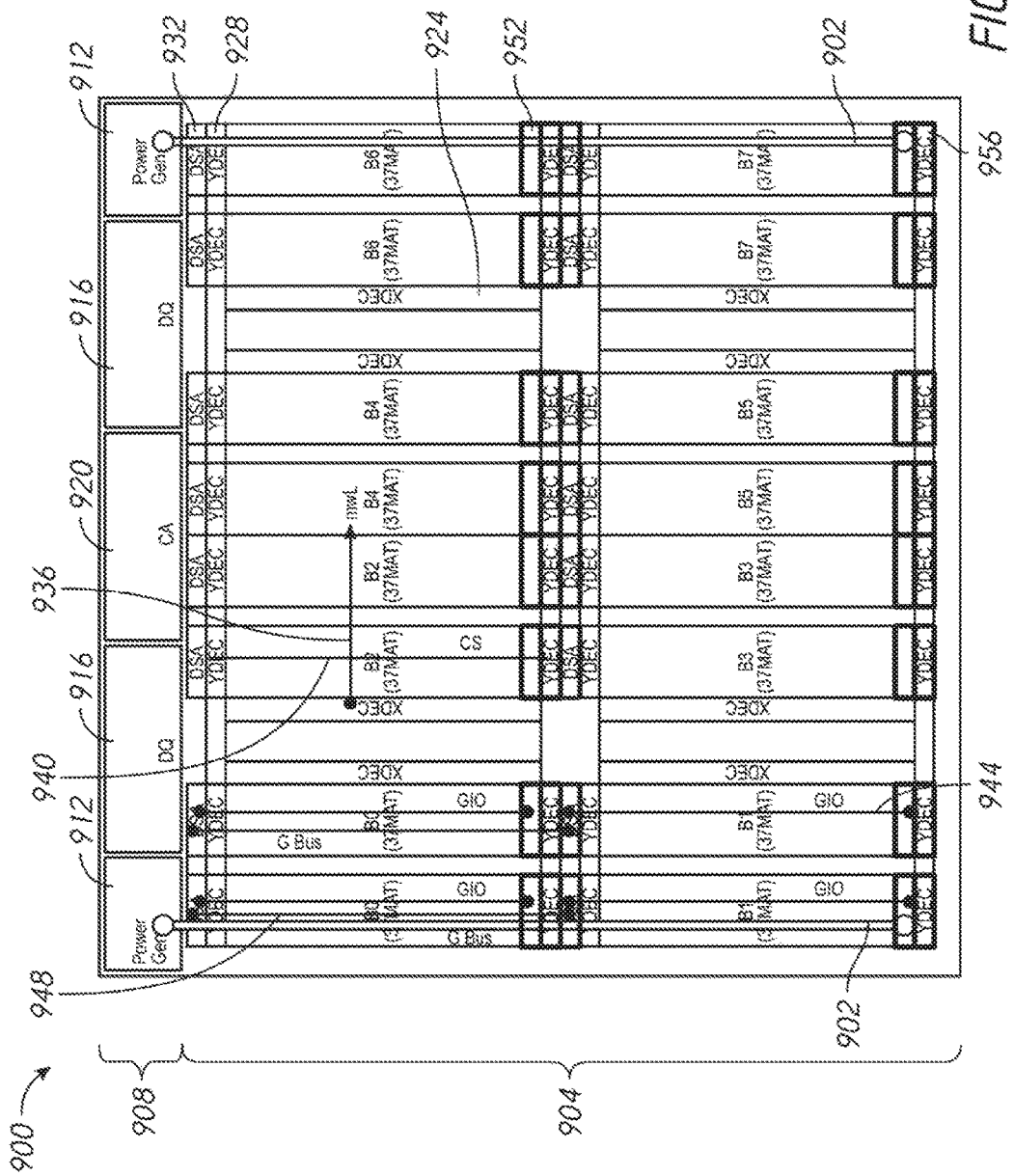
FIG. 9 is a schematic diagram that illustrates another example layout for a memory device in accordance with the present disclosure.

FIG. 9 provides a second example of a memory device 900 in accordance with the present disclosure that routes iRDL vias in device locations that lack certain metal layer wirings, but contain other device components such that the iRDL via routing area is not exclusively dedicated to iRDL vias. More specifically, the memory device 900 of FIG. 5 routes iRDL vias above both an edge MAT and a column decoder (YDEC).

FIG. 9 is a schematic diagram that illustrates an example layout for a memory device 900 in accordance with the present disclosure. The memory device 900 of FIG. 9 may correspond to the memory device of FIG. 2. Thus, the memory device 900 includes memory area 904 and a peripheral circuit 908 area. The memory area 904 may include a plurality of memory banks B0-B7, where a left side of the memory area 904 includes even-numbered memory banks (B0, B2, B4, B6) and a right side of the memory area 904 includes odd-numbered (B1, B3, B5, B7) memory banks.

The peripheral circuit 908 area may include various circuit components such as one or more power generators 912, one or more DQ pads 916, and/or one or more column address blocks 920. Within the memory area 904, the memory device additionally includes row decoders (XDEC) 924 that drive main word lines (MWL) 936, column decoders (YDEC) 928 that drive column select (CS) lines 940, and main amplifiers (DSA) 932 that provide coupling between global input/output lines (GIO) 944 and global buses (GBUS) 948.

The memory device 900 of FIG. 9 additionally includes example iRDL lines 902 that are coupled to the power generator blocks 920. FIG. 9 show two iRDL lines 902 by way of example and not limitation. It should be appreciated a memory device 900 in accordance with the present disclosure may include more or less iRDL lines 902 depending on the implementation. The iRDL lines 902 are generally configured to distribute power to various points within the memory area 904. The memory device 900 includes iRDL routing areas 962 located in the even number memory banks (B0, B2, B4, B6). An iRDL routing area 952 generally corresponds to an edge MAT (and the sense amplifier area (SAA) associated with the edge MAT) that is located farthest from the main amplifier 932 associated with the memory bank to which the edge MAT belongs. An iRDL routing area 952 additionally includes the column decoder 928 that is adjacent to the edge MAT. As can be seen in FIG. 9 (and more particularly in FIG. 3), global input/output lines 944 are not located in this iRDL routing area 952. Because the iRDL routing area 952 lacks global input/output lines 944 or other metal 3 layer at least in certain areas, one or more iRDL vias may be routed in the iRDL routing area 952. The routing of these one or more iRDL vias may be understood with reference to FIG. 10 which includes an enlarged view of an iRDL routing area 952.

Figure 10:
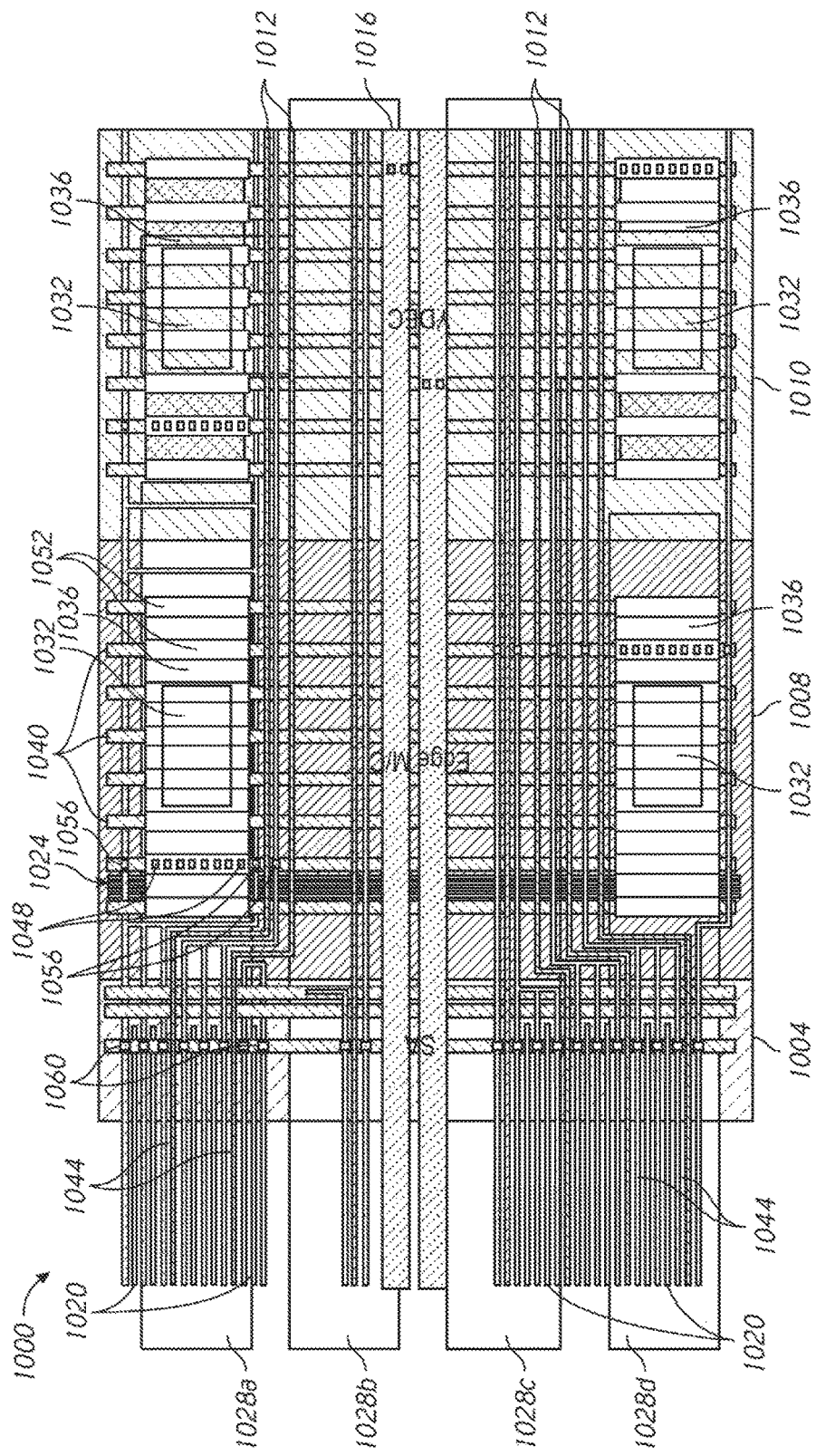
FIG. 10 is a plan view schematic diagram of a via routing area shown in FIG. 9.

FIG. 10 is a plan view schematic diagram of an iRDL routing area 1000. The iRDL routing area 1000 may correspond to the iRDL routing area 952 of FIG. 9 The iRDL routing area 1000 includes a sense amplifier area 1004, edge MAT 1008, and column decoder 1010. Global bus lines 1012 extend in the Y-direction across the sense amplifier area 1004, the edge MAT 1008, and the column decoder 1010. Control signals 1016, such as for the column decoder 1010 and/or a main amplifier (DSA), extend in the Y-direction across the sense amplifier area 1004, the edge MAT 1008, and the column decoder 1010. Global input/output (GIO) lines 1020 extend in the Y-direction, but end at the sense amplifier area 1004 such that they do not extend into the edge MAT 1008 or into the column decoder 1010. Main word lines (MWL) 1024 extend across the edge MAT 1008 in the X-direction. The global bus lines 1012, the control signal lines 1016, and the global input/output lines 1020 may be routed in a metal 3 layer. The main word lines 1024 may be routed in a metal 2 layer.

FIG. 10 additionally includes iRDL lines 1028a-d that extend in the Y-direction across the sense amplifier area 1004, the edge MAT 1008, and the column decoder 1010. FIG. 10 includes four iRDL lines 1028a-d (collectively lines 1028) by way of example and not limitation. As discussed in connection with FIG. 9, an iRDL line may be coupled to a power generator block and may be configured to distribute power to various points within a memory device. The iRDL lines 1028 of FIG. 10 include two outer iRDL lines 1028a,d and two inner iRDL lines 1028b,c. The iRDL lines 1028 may be routed in a metal 4 layer.

The iRDL lines 1028 may provide power to a power distribution network that is disposed in metal layers that underlie the metal layer of the iRDL line (M4 in one example). In order for power to be provided from the iRDL lines 1028 to the lower metal layers, the memory device may include vias that provide conductive pathways between various metal layers. iRDL vias (M4-M3 vias) 1032 may provide coupling between the iRDL lines 1028 and portions of the power distribution network that are located in the metal 3 layer. In the embodiment of FIG. 10, the iRDL vias 1032 are located above the edge MAT 1008 and the column decoder 1010 in areas that lack global input/output lines 1020 or other M3 wiring. As shown in FIG. 10, the area above the edge MAT 1008 and the column decoder 1010 and below the two outer iRDL lines 1028a,d lacks global input/output lines 1020 or other M3 wiring, while the area above the edge MAT 1008 and the column decoder 1010 and below the two inner iRDL lines 1028b,c includes M3 wiring such as the global bus lines 1012 and the control signal lines 1016. Thus, in the embodiment of FIG. 10, the iRDL vias 1032 are located in the area above the edge MAT 1008 and the column decoder 1010 and below the two outer iRDL lines 1028a,d.

As shown in FIG. 10, the iRDL visa 1032 may be coupled to power distribution nodes 1036 that are coupled to various power distribution wires. First power distribution wires 1040 may be located in the metal 3 layer. First power distribution wires 1040 may be arranged in the X-direction and may be configured to distribute power to the memory bank associated with memory mat 1004, as well as to memory banks that are adjacent in the X-direction. Second power distribution wires 1044 may be located in the metal 2 layer. The second power distribution wires 1044 may be generally arranged in the Y-direction and configured to transmit power from the first power distribution wires 1040 to components that are located adjacently in the Y-direction. For example, the second power distribution wires 1044 may transmit power from the first power distribution wires 1040 to sense amplifiers are that located in the sense amplifier area 1004.

The power distribution network of FIG. 10 may additionally M3-M2 vias that provide conductive pathways between components and wires in the metal 3 layer and the metal 2 layer. A first group of M3-M2 vias 1048 provide a conductive pathway between the power distribution nodes 1036 and the first power distribution wires 1040. FIG. 10 shows M3-M2 vias 1048 between the distribution nodes 1036 and particular first power distribution wires 1040 by way of example and not limitation. In alternative embodiments, M3-M2 vias 1048 may be provided between the distribution nodes 1036 and any of the first power distribution wires 1040 shown in FIG. 10. Possible M3-M2 vias 1048 routing locations are generally indicated in FIG. 10 by enclosed areas 1052. A second group of M3-M2 vias 1056 provide a conductive pathway between the first power distribution wires 1040 and the second distribution wires 1044. A third group of M3-M2 vias 1060 provide a conductive pathway between the second distribution wires 1044 and components in the sense amplifier area 1004.

Referring again to FIG. 9, the memory device 900 additionally includes iRDL routing areas located in odd numbered memory banks (B1, B3, B5, B7). iRDL routing areas located in the odd number memory banks (B1, B3, B5, B7) are generally indicated with reference number 956. An iRDL routing area 956 generally corresponds to an edge MAT (and the sense amplifier area (SAA) associated with the edge MAT) that is located farthest from the main amplifier 932 associated with the memory bank to which the edge MAT belongs. An iRDL routing area 956 additionally includes the column decoder 928 that is adjacent to edge MAT. As can be seen in FIG. 9 (and more particularly in FIG. 3), global input/output lines 944 are not located in this iRDL routing area 952. Additionally, global bus lines 948 are not located in this iRDL routing area 956. Because the iRDL routing area 956 lacks global input/output lines 944, global bus lines 948 or other metal 3 layer at least in certain areas, one or more iRDL vias may be routed in the iRDL routing area 956. The routing of these one or more iRDL vias may be understood with reference to FIG. 11 which includes an enlarged view of an iRDL routing area 956.

Figure 11:
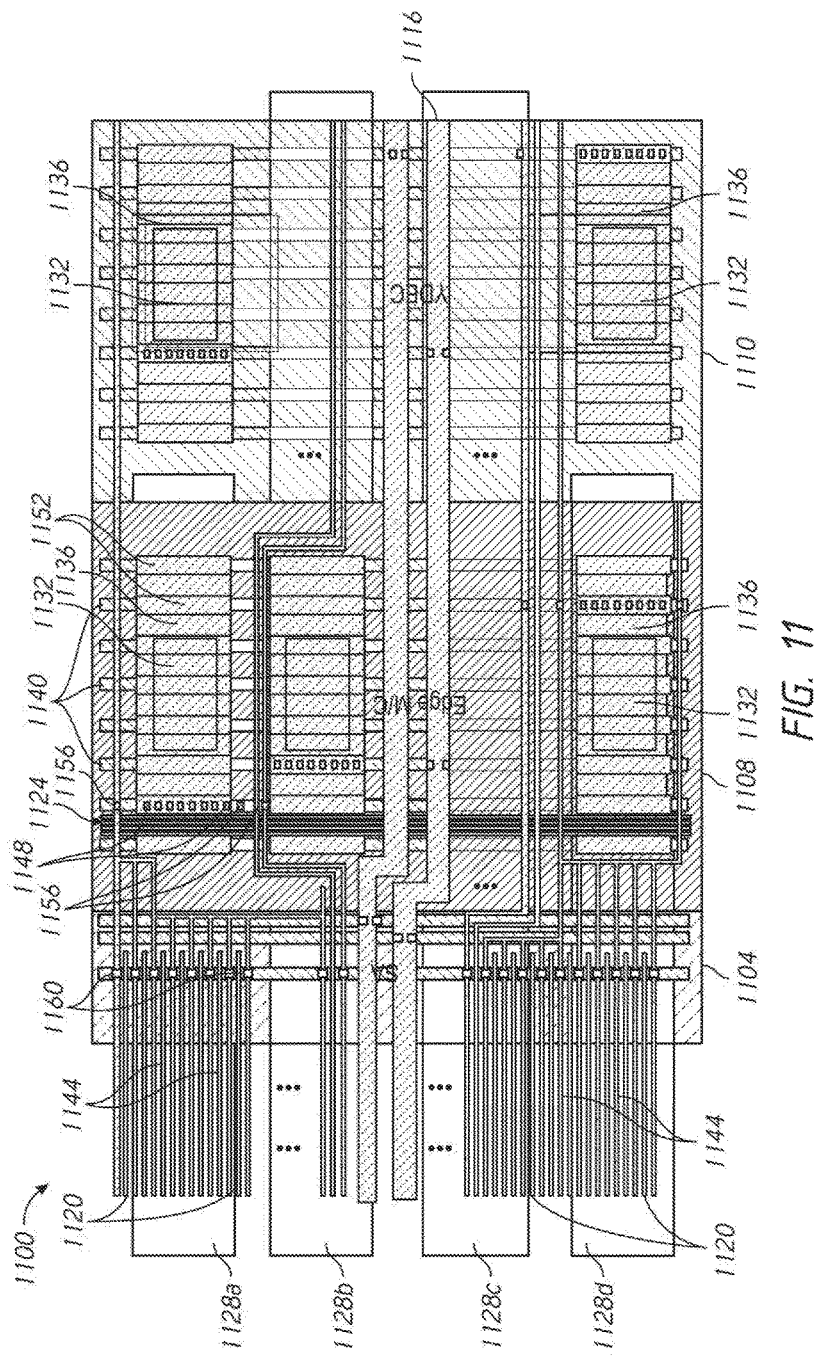
FIG. 11 is a plan view schematic diagram of another via routing area shown in FIG. 9.

FIG. 11 is a plan view schematic diagram of an iRDL routing area 1100. The iRDL routing area 1100 may correspond to the iRDL routing area 956 of FIG. 9 The iRDL routing area 1100 includes a sense amplifier area 1104, edge MAT 1108, and column decoder 1110. Control signals 1116, such as for the column decoder 1110 and/or a main amplifier (DSA), extend in the Y-direction across the sense amplifier area 1104, the edge MAT 1108, and the column decoder 1110. Global input/output (GIO) lines 1120 extend in the Y-direction, but end at the sense amplifier area 1104 such that they do not extend into the edge MAT 1108 or into the column decoder 1110. Main word lines (MWL) 1124 extend across the edge MAT 1108 in the X-direction. The control signal lines 1116 and the global input/output lines 1120 may be routed in a metal 3 layer. The main word lines 1124 may be routed in a metal 2 layer.

FIG. 11 additionally includes iRDL lines 1128a-d, that extend in the Y-direction across the sense amplifier area 1104, the edge MAT 1108, and the column decoder 1110. FIG. 11 includes four iRDL lines 1128a-d (collectively, iRDL lines 1128) by way of example and not limitation. As discussed in connection with FIG. 9, an iRDL line may be coupled to a power generator block and may be configured to distribute power to various points within a memory device. The iRDL lines 1128 of FIG. 11 include two outer iRDL lines 1128a,d and two inner iRDL lines 1128b,c. The iRDL lines 1128 may be routed in a metal 4 layer.

The iRDL tines 1128 may provide power to a power distribution network that is disposed in metal layers that underlie the metal layer of the iRDL line (M4 in one example). In order for power to be provided from the iRDL lines 1128 to the lower metal layers, the memory device may include vias that provide conductive pathways between various metal layers. iRDL vias (M4-M3 vias) 1132 may provide coupling between the iRDL lines 1128 and portions of the power distribution network that are located in the metal 3 layer. In the embodiment of FIG. 10, the iRDL vias 1132 are located above the edge MAT 1108 and the column decoder 1110 in areas that lack global input/output lines 1120 or other M3 wiring. As shown in FIG. 11, the area above the edge MAT 1108 and the column decoder 1110 and below the two outer iRDL lines 1128a,d lacks global input/output lines 1120 or other M3 wiring. Additionally, the area above the edge MAT 1108 and the column decoder and below one inner iRDL line 1128b also lacks global input/output lines 1120 or other M3 wiring, while the area above the edge MAT 1108 and the and the column decoder 1110 and below the other inner iRDL line 1128c includes M3 wiring such as the control signal lines 1116. Thus, in the embodiment of FIG. 11, the iRDL vias 1132 are located in the areas above the edge MAT 1108 and the column decoder 1110 and below the two outer iRDL lines 1128a,d and above the edge MAT 1108 and the column decoder 1110 and below the one inner iRDL line 1128b.

As shown in FIG. 11, the iRDL vias 1132 may be coupled to power distribution nodes 1136 that are coupled to various power distribution wires. First power distribution wires 1140 may be located in the metal 3 layer. First power distribution wires 1140 may be arranged in the X-direction and may be configured to distribute power to the memory bank associated with memory mat 1104, as well as to memory banks that adjacent in the X-direction. Second power distribution wires 1144 may be located in the metal 2 layer. The second power distribution wires 1144 may be generally arranged in the Y-direction and configured to transmit power from the first power distribution wires 1140 to components that are located adjacently in the Y-direction. For example, the second power distribution wires 1144 may transmit power from the first power distribution wires 1140 to sense amplifiers that are located in the sense amplifier area 1104.

The power distribution network of FIG. 11 may additionally include M3-M2 vias that provide conductive pathways between components and wires in the metal 3 layer and the metal 2 layer. A first group of M3-M2 vias 1148 provide a conductive pathway between the power distribution nodes 1136 and the first power distribution wires 1140. FIG. 11 shows M3-M2 vias 1148 between the distribution nodes 1136 and particular first power distribution wires 1140 by way of example and not limitation. In alternative embodiments, M3-M2 vias 1148 may be provided between the distribution nodes 1136 and any of the first power distribution wires 1140 shown in FIG. 11. Possible M3-M2 vias 1148 routing locations a generally indicated in FIG. 11 by enclosed areas 1152. A second group of M3-M2 vias 1156 provide a conductive pathway between the first power distribution wires 1140 and the second distribution wires 1144. A third group of M3-M2 vias 1160 provide a conductive pathway between the second distribution wires 1144 and components in the sense amplifier area 1104.

iRDL Vias Over Adjacent Edge MATs

Figure 12:
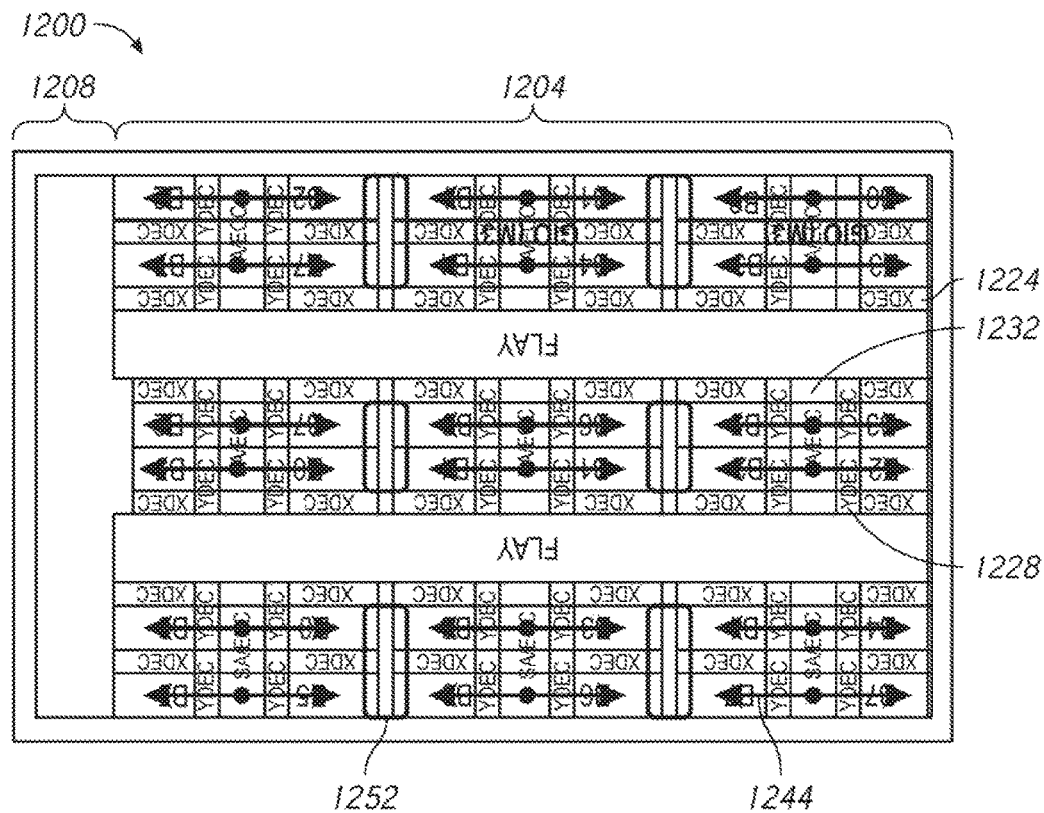
FIG. 12 is a schematic diagram that illustrates another example layout for a memory device in accordance with the present disclosure.

FIG. 12 provides a third example of a memory device 1200 in accordance with the present disclosure that routes iRDL vias in device locations that lack certain metal layer wirings, but contain other device components such that the iRDL via routing area is not exclusively dedicated to iRDL vias. More specifically, the memory device 1200 of FIG. 12 routes iRDL vias above two adjacent edge MATs that face each other.

FIG. 12 is a schematic diagram that illustrates an example layout for a memory device 1200 in accordance with the present disclosure. The memory device 1200 of FIG. 12 is an alternative configuration with some similarities to the memory device 200 of FIG. 2. Thus, the memory device 1200 includes memory area 1204 and a peripheral circuit 1208 area. The memory area 1204 may include a plurality of memory banks, three of which are shown in the figure by way of example and limitation. The peripheral circuit 1208 area may include various circuit components such as one or more power generators, one or more DQ pads, and/or one or more column address blocks. The various components that may be included in the peripheral circuit 1208 area are omitted from the drawing in order to simply the figure. Within the memory area 1204, the memory device additionally includes row decoders (XDEC) 1224, column decoders (YDEC) 1228, and main amplifiers (DSA) 1232 that provide coupling between global input/output lines (GIO) 1244 and global buses (GBUS). Global buses are also mitted from the omitted from the drawing in order to simply the figure.

The memory device 1200 includes iRDL, routing areas 1252 located above two adjacent edge MATs that face each other. An iRDL routing area 1252 generally corresponds to two edge MATs that face each other and that are located halfway between two main amplifiers 1232 associated with the memory bank to which the edge MATs belongs. As can be seen in FIG. 12, global input/output lines 1244 are not located in this iRDL routing area 1252. Because the iRDL routing area 1252 lacks global input/output lines 1244 or other metal 3 layer at least in certain areas, one or more iRDL vias may be routed in the iRDL routing area 1252. The routing of these one or more iRDL vias may be understood with reference to FIG. 13 which includes an enlarged view of an iRDL routing area 1252.

Figure 13:
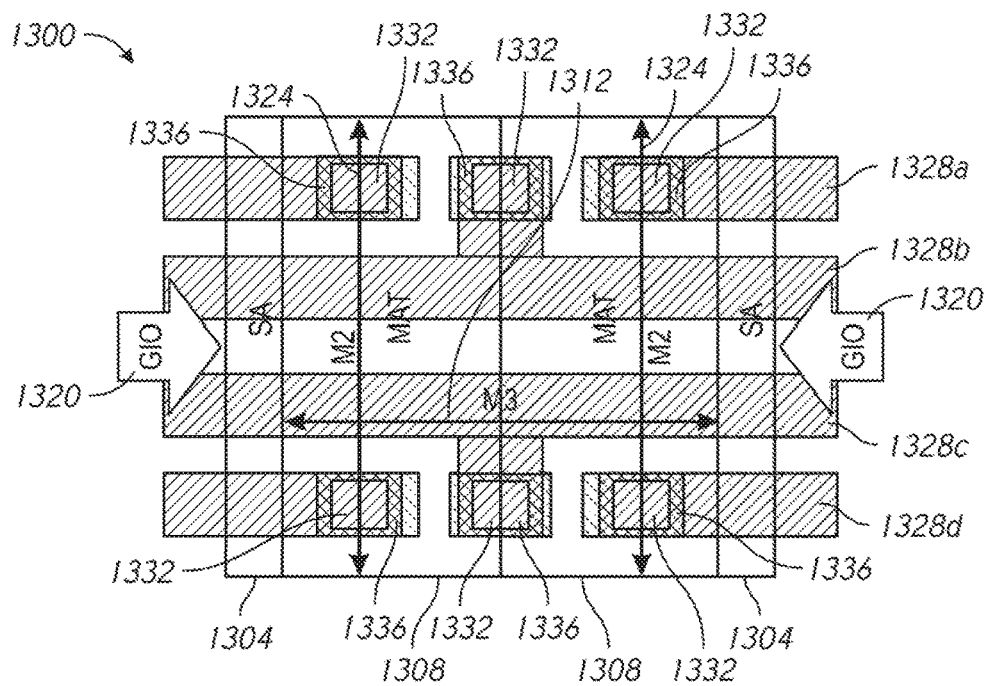
FIG. 13 is a plan view schematic diagram of a via routing area shown in FIG. 12.

FIG. 13 is a plan view schematic diagram of an iRDL routing area 1300. The iRDL routing area 1300 may correspond to the iRDL routing area 1252 of FIG. 12. The iRDL routing area 1300 includes a sense amplifier areas 1304 and two edge MATs 1308 that face each other. Global bus lines 1312 extend in the Y-direction across the sense amplifier areas 1304 and the edge MATs 1308 Control signals, such as for a column decoder (YDEC) and/or a main amplifier (DSA), may also extend in the Y-direction across the sense amplifier areas 1304 and the edge MATs 1308. Global input/output (GIO) lines 1320 extend in the Y-direction, but end at the sense amplifier areas 1304 such that they do not extend into the edge MATs 1308. Main word lines (MWL) 1324 extend across the edges MAT 1308 in the X-direction. The global bus lines 1312 and the global input/output lines 1320 may be routed in a metal 3 layer. The main word lines 1324 may be routed in a metal 2 layer.

FIG. 13 additionally includes iRDL lines 1328a-d that extend in the Y-direction across the sense amplifier areas 1304 and the edge MATs 1308. FIG. 13 includes four iRDL lines 1328a-d (collectively iRDL lines 1328) by way of example and not limitation. An iRDL line may be coupled to a power generator block and may be configured to distribute power to various points within a memory device. The iRDL lines 1328 of FIG. 13 include two outer iRDL lines 1328a,d and two inner iRDL lines 1028b,c. The iRDL lines 1328 may be routed in a metal 4 layer.

The iRDL lines 1328 may provide power to a power distribution network that is disposed in metal layers that underlie the metal layer of the iRDL line (M4 in one example). In order for power to be provided from the iRDL lines 1328 to the lower metal layers, the memory device may include vias that provide conductive pathways between various metal layers. iRDL vias (M4-M3 vias) 1332 may provide coupling between the iRDL lines 1328 and portions of the power distribution network that are located in the metal 3 layer. In the embodiment of FIG. 13, the iRDL vias 1332 are located above the edge MATs 1308 in areas that lack global input/output lines 1320 or other M3 wiring. As shown in FIG. 13, the area above the edges MAT 1308 and below the two outer iRDL lines 1328a,d lacks global input/output lines 1320 or other M3 wiring, while the area above the edge MAT 1308 and below the two inner iRDL lines 1328b,c includes M3 wiring such as the global bus lines 1312. Thus, in the embodiment of FIG. 13, the iRDL vias 1332 are located in the area above the edges MAT 1308 and below the two outer iRDL lines 1328a,d.

As shown in FIG. 13, the iRDL vias 1332 may be coupled to power distribution nodes 1336 that may be coupled to various power distribution wires. The power distribution nodes 1336, power distribution wires and related components may correspond to similar components described above in connection with FIGS. 6, 8, 10, and 11.

The above specification, examples and data provide a complete description of the structure and use of exemplary embodiments of the invention as defined in the claims.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the invention as defined in the following claims.

The foregoing description has broad application. The discussion of any embodiment is meant only to be explanatory and is not intended to suggest that the scope of the disclosure, including the claims, is limited to these examples. In other words, while illustrative embodiments of the disclosure have been described in detail herein, the inventive concepts may be otherwise variously embodied and employed, and the appended claims are intended to be construed to include such variations, except as limited by the prior art.

The invention claimed is:

1. A semiconductor device, comprising:
   an uppermost metal layer including a power supply enhancing wiring;
   power supply wiring coupled to the power supply enhancing wiring through a via between the uppermost metal layer and a metal layer underlying the uppermost metal layer;
   at least one memory device component disposed in vertical alignment with the via between the uppermost metal layer and the metal layer underlying the uppermost metal layer; and
   a memory bank, including:
      a plurality of sense amplifiers;
      a plurality of memory mats coupled to the sense amplifiers, the memory mats including first and second edge mats; and
      a global input/output line coupled to the sense amplifiers and disposed over the first edge mat and not disposed over the second edge mat;
   wherein the at least one memory device component disposed in vertical alignment with the via includes the second edge mat.

2. The semiconductor device of claim 1, wherein the via between the uppermost metal layer and the metal layer underlying the uppermost metal layer is a first via, the semiconductor device further comprising:
   a column decoder adjacent to the second edge mat; and
   a second via between the uppermost metal layer and the metal layer underlying the uppermost metal layer, wherein the second via is disposed in vertical alignment with the column decoder.

3. The semiconductor device of claim 2, further comprising:
   a third via between the uppermost metal layer and the metal layer underlying the uppermost metal layer, wherein the third via is disposed in vertical alignment with the second edge mat; and
   a fourth via between the uppermost metal layer and the metal layer underlying the uppermost metal layer, wherein the fourth via is disposed in vertical alignment with the column decoder.

4. The semiconductor device of claim 1, wherein the memory bank is a first memory bank, the via between the uppermost metal layer and the metal layer underlying the uppermost metal layer is a first via, and the global input/output line is a first global input/output line, the semiconductor device further comprising:
   a second memory bank adjacent to the first memory bank, the second memory bank including:
      a plurality of sense amplifiers;
      a plurality of memory mats coupled to the sense amplifiers, the memory mats including a first and second edge mat; and
      a second global input/output line coupled to the sense amplifiers of the second memory bank and disposed over the first edge mat of the second memory bank and not disposed over the second edge mat of the second memory bank;
   a second via between the uppermost metal layer and the metal layer underlying the uppermost metal layer, wherein the second via is disposed in vertical alignment with the second edge mat of the second memory bank.

5. The semiconductor device of claim 4, further comprising:
   a global bus line disposed over the first memory bank and not disposed over the second memory bank; and
   a third via between the uppermost metal layer and the metal layer underlying the uppermost metal layer, wherein the third via is disposed in vertical alignment with the second edge mat of the second memory bank and in horizontal alignment with the global bus line.

6. The semiconductor device of claim 5, further comprising:
   a fourth via between the uppermost metal layer and the metal layer underlying the uppermost metal layer, wherein the fourth via is disposed in vertical alignment with the second edge mat of the first memory bank; and
   a fifth via between the uppermost metal layer and the metal layer underlying the uppermost metal layer, wherein the fifth via is disposed in vertical alignment with the second edge mat of the second memory bank.

7. The semiconductor device of claim 6, further comprising:
   a column decoder adjacent to the second edge mat of the first memory bank; and
   a sixth via between the uppermost metal layer and the metal layer underlying the uppermost metal layer, wherein the sixth via is disposed in vertical alignment with the column decoder; and
   a seventh via between the uppermost metal layer and the metal layer underlying the uppermost metal layer, wherein the seventh via is disposed in vertical alignment with the column decoder.

8. The semiconductor device of claim 7, wherein the column decoder is a first column decoder, the semiconductor device further comprising:
   a second column decoder adjacent to the second edge mat of the second memory bank;
   an eighth via between the uppermost metal layer and the metal layer underlying the uppermost metal layer, wherein the eight via is disposed in vertical alignment with the second column decoder; and
   a ninth via between the uppermost metal layer and the metal layer underlying the uppermost metal layer, wherein the ninth via is disposed in vertical alignment with the second column decoder.

9. A semiconductor device, comprising:
   an uppermost metal layer including a power supply enhancing wiring;

power supply wiring coupled to the power supply enhancing wiring through a via between the uppermost metal layer and a metal layer underlying the uppermost metal layer;

at least one memory device component disposed in vertical alignment with the via between the uppermost metal layer and the metal layer underlying the uppermost metal layer;

a plurality of memory mats; and a plurality of sense amplifiers arranged between at least some of the memory mats; wherein the plurality of memory mats include first and second memory mats that are directly adjacent such that no sense amplifier of the plurality of sense amplifiers is disposed between the first and second memory mats; and the at least one memory device component disposed in vertical alignment with the via includes the first memory mat.

10. The semiconductor device of claim 9, wherein the via between the uppermost metal layer and the metal layer underlying the uppermost metal layer is a second via, the semiconductor device further comprising:

a second via between the uppermost metal layer and the metal layer underlying the uppermost metal layer, wherein the second via is disposed in vertical alignment with the second edge mat.

* * * * *